United States Patent [19]
Oka et al.

[11] Patent Number: 5,177,758
[45] Date of Patent: Jan. 5, 1993

[54] SEMICONDUCTOR LASER DEVICE WITH PLURAL ACTIVE LAYERS AND CHANGING OPTICAL PROPERTIES

[75] Inventors: Akihiko Oka, Kokubunji; Shinji Sakano, Hachioji; Naoki Chinone, Chofu; Tsukuru Ohtoshi, Kokubunji; Kazuhisa Uomi, Hachioji; Tomonobu Tsuchiya, Kodaira; Makoto Okai, Tokorozawa, all of Japan

[73] Assignee: Hitachi, Ltd., Tokyo, Japan

[21] Appl. No.: 803,206

[22] Filed: Dec. 6, 1991

Related U.S. Application Data

[62] Division of Ser. No. 537,901, Jun. 13, 1990, Pat. No. 5,119,393.

[30] Foreign Application Priority Data

Jun. 14, 1989 [JP] Japan .................. 1-149603
Sep. 1, 1989 [JP] Japan .................. 1-224463

[51] Int. Cl.⁵ ............................... H01S 3/19
[52] U.S. Cl. .................................. 372/50; 372/20; 372/33; 372/45; 372/46; 372/96; 372/98; 372/102

[58] Field of Search ............ 372/50, 20, 33, 45, 372/46, 96, 98, 102

[56] References Cited

U.S. PATENT DOCUMENTS

| | | | |
|---|---|---|---|
| 4,653,058 | 3/1987 | Akiba et al. | 372/50 |
| 4,719,636 | 1/1988 | Yamaguchi | 372/50 |
| 4,788,690 | 11/1988 | Akiba et al. | 372/50 |
| 4,899,361 | 2/1990 | Numai | 372/50 |
| 4,920,542 | 4/1990 | Brosson et al. | 372/50 |

Primary Examiner—Georgia Y. Epps
Attorney, Agent, or Firm—Kenyon & Kenyon

[57] ABSTRACT

A wavelength-tunable semiconductor laser device presenting a large wavelength-tunable range or a very-high-speed modulating semiconductor laser device having a distributed feedback structure including a diffraction grating as in the case of a DBR laser or a DFB laser incorporates therein a plurality of active layers differing from one another in constituent elements or composition ratio or thickness for reducing spectral line widths, while improving single-mode spectral oscillation characteristics.

36 Claims, 14 Drawing Sheets

F I G. 1
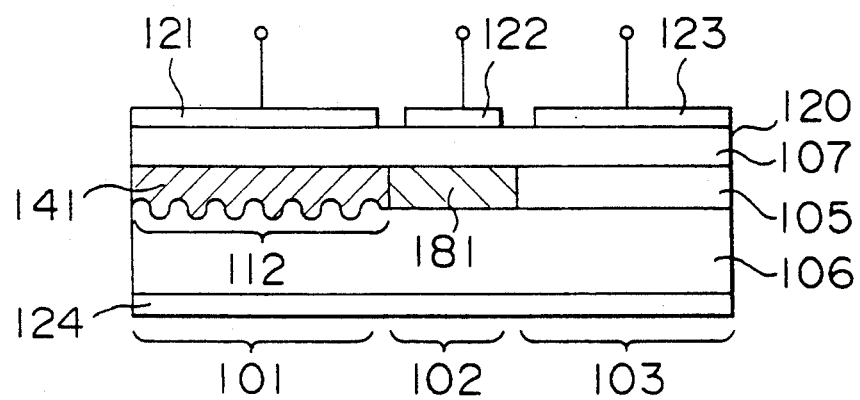

F I G. 11
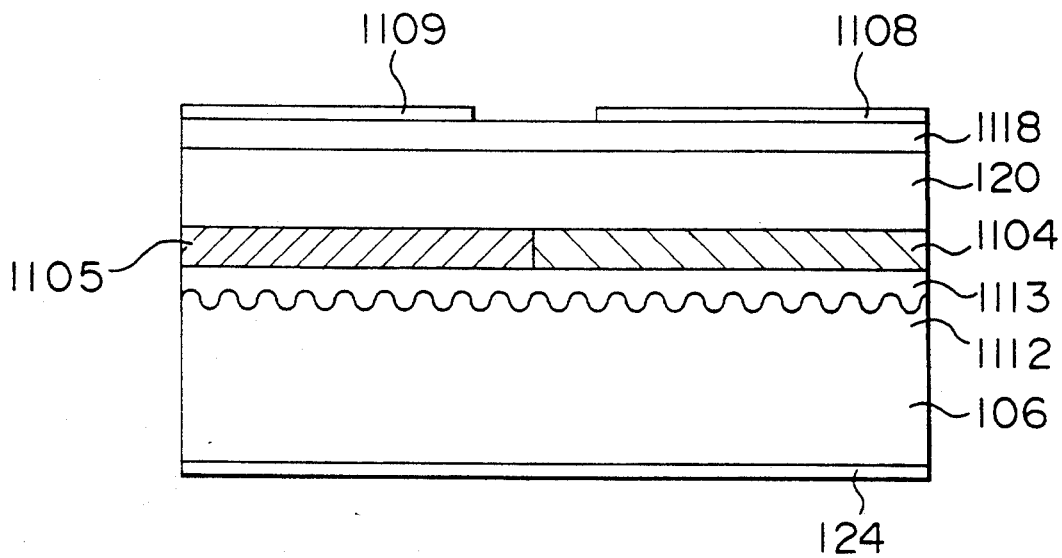
F I G. 12
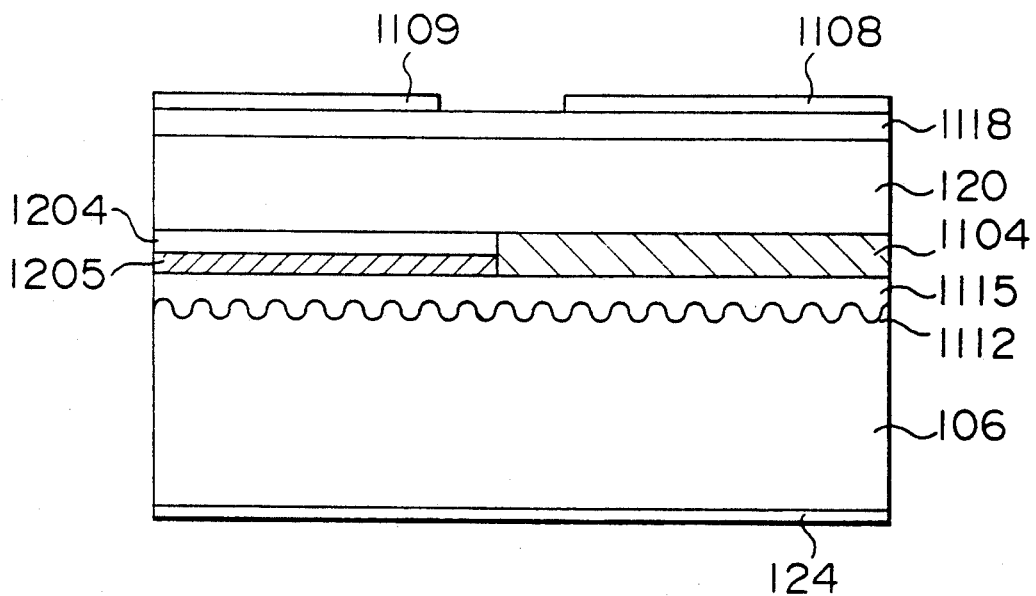

F I G. 19E
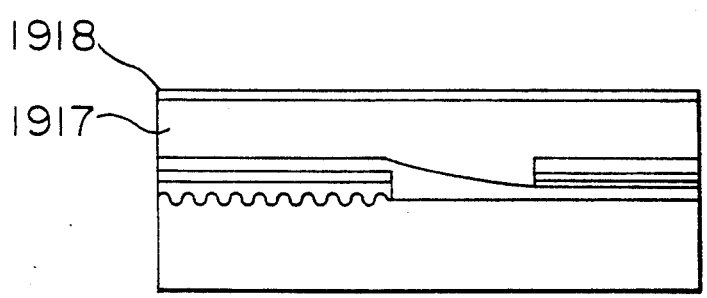
F I G. 19F
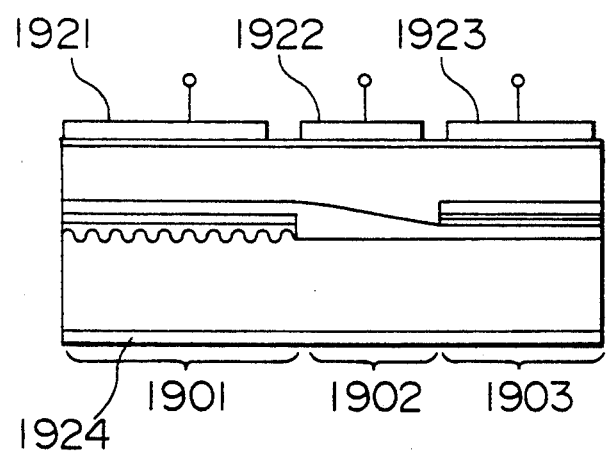

SEMICONDUCTOR LASER DEVICE WITH PLURAL ACTIVE LAYERS AND CHANGING OPTICAL PROPERTIES

This application is a divisional of 07/537,901 filed Jun. 13, 1990, now U.S. Pat. No. 5,119,393.

BACKGROUND OF THE INVENTION

1. Field of the Invention

The present invention generally relates to a semiconductor device. More particularly, the present invention is concerned with a semiconductor device which can be advantageously and profitably applied to a single-mode oscillation semiconductor device typified by a wavelength-tunable semiconductor laser device for a coherent optical communication, a semiconductor laser device for a high-speed communication and others.

2. Description of the Related Art

For a large capacity optical communication system the use of a wavelength-tunable semiconductor laser device and a modulating semiconductor laser device is required. For a better understanding of the present invention, description will first be made in some detail of the technology known heretofore in conjunction with these laser devices.

First, the wavelength-tunable semiconductor laser is considered. As one of the large-capacity communication systems, there can be mentioned a coherent optical communication system in which an interference receiver is employed not only for making it possible to increase the reception sensitivity but also for allowing only light signals of different wavelengths to be selectively extracted by varying the wavelength of the interference light for reception. In other words, with the coherent optical communication system, there can be realized a wavelength-multiplexed communication in which channel selection can be effected with the aid of the light wavelength by employing a laser light source having a changeable oscillation wavelength in the receiver. Intrinsically, the optical communication has a significantly increased transmission capacity because of the capability of high-speed modulation as compared with the electronic signal transmissions utilized heretofore. Further, in the case of the wavelength-multiplexed communication, it is possible to increase surprisingly the transmission capacity because a great number of light signals of different wavelengths can be transmitted through the medium of only one optical fiber. For these reasons, the coherent wavelength-multiplexed optical communication is now attracting increasingly public attention as one of the communication techniques for supporting the age of large-capacity communication anticipated in the not too distant future.

In order to realize the wavelength-multiplexed optical communication, the receiver side a semiconductor laser is required to have as broad a wavelength-tunable range or width as possible and capable of a single wavelength oscillation (single-mode oscillation).

As the wavelength-tunable semiconductor laser reported in the past, there can be mentioned a laser described in "Electronics Letters", Vol. 23, No. 8, (1987), pp. 403–405, the structure of which is shown in FIG. 8 of the accompanying drawings. This semiconductor laser is referred to as the DBR laser (an abbreviation of distributed Bragg reflection laser) and composed of three regions provided on a substrate 806, i.e. a distributed Bragg reflection region (DBR region) 801, a phase control region 802 and an optical amplification region 803, wherein p-type electrodes 821, 822 and 823 are provided independently on the above-mentioned regions, respectively, with a common n-type electrode 824 being provided on the lower surface of the substrate 806. An active layer 815 is formed solely in the optical amplification region 803, whereby light is amplified in the optical amplification region by carriers injected through the electrode 823. The two other regions include no active layer and are constituted with a passive optical waveguide 813 whose refractive index is forced to vary by the carriers injected through the electrodes 821 and 822.

As is known in the art, the oscillation wavelength of the DBR laser is determined by the Bragg reflection wavelength which in turn is determined on one hand by a product (optical pitch) of the effective refractive index experienced by the light transferred through the optical waveguide within the DBR region 801 and the pitch of a diffraction grating 812 implemented in the Bragg reflection region 801 and on the other hand by a resonance wavelength satisfying the phase condition of light traveling through the optical waveguide 813 reciprocatively between an edge 820 located on the side of the optical amplifier region and the DBR region. Consequently, in order to vary the laser oscillation wavelength continuously, it is necessary to vary simultaneously both the Bragg reflection wavelength and the resonance wavelength while maintaining both of these wavelengths so as to coincide with each other. According to the above-mentioned prior art technology, a continuous wavelength-tunable width or range is realized for a single wavelength (in a single-oscillation mode) by controlling both the Bragg reflection wavelength and the resonance wavelength.

In this conjunction, another example of the DBR laser is reported in "Applied Physics Letter", Vol. 52, No. 16, (1988), pp. 1285–1287. In the case of this known wavelength-tunable semiconductor laser, the DBR region is formed of an optically active material similar to the optical amplification region, wherein independent electrodes are provided separately for the purpose of allowing the oscillation wavelength to change under the influence of the change in the density of injected carriers, as in the case of the preceding example. However, the DBR laser now under consideration differs from that disclosed in the first mentioned literature in that a greater change of the refractive index ascribable to an absorption edge shift effect which accompanies the carrier injection is made available by using the optically active material for the DBR region. By virtue of this structure, a value as large as 11.6 nm is realized for the wavelength-tunable width. (It is however noted that the tunable width or range realized in this prior art DBR laser is not for the continuous change of wavelength but for discrete change thereof.)

The structure of the second mentioned DBR laser however suffers from the problems in that absorption loss brought about by the free carriers is increased as the amount of carrier injected increases, because a passive material is used for the DBR region and the phase control region, whereby the value or level of threshold current for oscillation of the optical amplification region is increased, which results in lowering of the laser output power and increasing in the spectral line width. In this conjunction, it is to be noted that the coherent optical communication requires a narrow spectral line width of the laser light. Accordingly, the phenomenon of increasing is brought about the spectral line width is brought about by changing the wavelength can never be tolerated.

A semiconductor laser device developed in an effort to solve the technical problem of the increasing of the spectral line width is disclosed, for example, in JP-A-64-49293 (Japanese Patent Application Laid-Open No. 49293/1989). In this known semiconductor laser, an optically active layer exhibiting a gain is provided in the DBR region. With this known semiconductor laser structure, it is certainly possible to compensate for the absorption loss occurring upon current injection into the phase control region by the gain of the active layer provided in the DBR region, whereby the spectal line width can be suppressed from increasing. Further, such a structure is also known in which the phase control region and the optical amplification region are finely divided and arranged alternately with each other for thereby protecting the laser characteristics against degradation due to the absorption loss mentioned above. In this conjunction, reference may also have to be made to JP-A-64-14988.

Now, description will be turned to the semiconductor laser for modulation.

In the optical communication system, one of the requisite performances imposed on the system is how densely the signal can be transmitted and received. To this end, high-speed response capability must be ensured in both the light signal transmitter and receiver devices. In general, modulation of the semiconductor laser light with a high-speed current pulse signal is ordinarily attended with fluctuation in the wavelength due to change in the refractive index internally of the laser. This phenomenon is known as wavelength chirping. Causes for wavelength chirping will be explained below.

The density of carriers injected in the active region of the semiconductor laser by current pulses of a modulation signal is forced to change in accordance with the modulating signal. In this conjunction, it is noted that a phase delay occurs in the laser output light pulse relative to the change in the carrier density. As the consequence, the carrier density becomes dominant such that the carriers exist in excess when compared with the stable state.

Upon oscillation of the laser light, the carrier density tends to decrease toward the stable state as a result of the stimulated emission. This means that during the oscillation of the laser light, the carrier density continues to change. Since the refractive index of the active layer has a dependency on the carrier density, the change thereof brings about corresponding fluctuation in the laser oscillation wavelength. This is a cause of the wavelength chirping phenomenon. Since the optical fiber employed for the optical communication or the like application exhibits a wavelength-dependent dispersion of the refractive index (wavelength dispersion), occurrence of the wavelength chirping gives rise to distortion in the pulse waveform. This provides a major factor for limiting the distance of transmission in the high-speed transmission.

With a view to reducing or suppressing the wavelength chirping taking place upon high-speed modulation of the semiconductor laser, there has already been reported a method of applying electric currents to a plurality of electrodes disposed in cascade along the direction of the resonator. In this conjunction, reference may have to be made to "IEEE Journal of Lightwave Technology", LT-5, No. 4, (1987), pp. 516–522. More specifically, according to this known method, a plurality of electrodes are provided for the active regions having a same composition (same bandgap), wherein the mutually different electric currents are so applied to the plural electrodes that the wavelength chirping can be reduced.

SUMMARY OF THE INVENTION

The wavelength-tunable laser implemented in such structure for suppressing the spectral line width from increasing, as described above, suffers from a problem that it exhibits a high gain for the injected carriers, because the same active layer is employed for both the optical amplification region and the DBR region. In other words, upon injection of the carriers in the DBR region for changing the wavelength, self-oscillation takes place only in this DBR region to disadvantage.

This problem will be discussed below in more detail by reference to the accompanying drawings. In case an active material is used for the diffraction grating region, the gain in this region becomes high and self-oscillation takes place at a gain coefficient which exceeds about 40 cm$^{-1}$, whereby limitation is imposed to the change in the wavelength. Now, reference is made to FIGS. 15 and 16, wherein FIG. 15 is a view for graphically illustrating changes in the refractive index of the optical waveguide and the gain brought about by the injection of carriers in the passive optical waveguide. As the injection current I increases, the refractive index is decreased approximately in proportion to $I^{\frac{1}{2}}$, which is also accompanied with increasing in the absorption, resulting in that the absorption loss is increased excessively to such an extent that the spontaneous emission ceases. FIG. 16 of the accompanying drawings is a view for illustrating the change in the refractive index in the case where an optical waveguide having a gain of a conventional semiconductor laser is employed in the diffraction grating region as an active optical waveguide. For the carrier injection, there can be realized a greater rate of change of the refractive index as compared with that of the passive optical waveguide due to the band filling effect. However, the refractive index ceases to change at an increased value of gain at which self-oscillation takes place.

Once the self-oscillation has taken place, the carrier density in the relevant region is fixed, resulting in that the range within which the wavelength can be tuned is limited, presenting a problem remaining to be solved that a desired wavelength-tunable width becomes unavailable.

Further, it is noted in conjunction with the DBR laser that the necessity for the gain of the DBR region is only for the purpose of compensating for the absoption loss occurring in the phase control region. In other words, it is necessary to impart a sufficiently high gain to the DBR region for compensating for the absorption loss brought about by the current flowing through the phase control region. Accordingly, for a large magnitude of the absorption loss, the DBR region starts to oscillate due to its own gain as a result of effort to compensate for the absorption loss, thus giving rise to a basic problem to be solved. It should be added that the measures of dividing finely the phase control region and the optical amplification region are not in the position to eliminate drastically or effectively the absorption taking place in the phase control region.

On the other hand, in the case of the modulating laser in which the measures for suppressing the wavelength chirping is adopted, as described hereinbefore, there is a problem that the range for the bias condition and selection of the light output becomes necessarily limited, which is additionally attended with a problem that the high-speed characteristics are also limited.

It is therefore an object of the present invention to solve the technical problems of the prior art semiconductor laser described above and provide a semiconductor laser device which is capable of oscillating stably at a desired wavelength.

Another object of the present invention is to provide a semiconductor laser device capable of exhibiting an increased refractive index change width (or range) without being subjected to limitation imposed by the absorption and the gain such as described above.

A still further object of the invention is to provide a semiconductor laser device in which an increased wavelength-tunable width can be realized and fluctuation in the oscillation output at a selected wavelength can be reduced by suppressing the gain coefficient from increasing due to carrier injection to a given one of a plurality of active layers.

In view of the above and other objects which will become more apparent as description proceeds, there is provided according to an aspect of the invention a semiconductor laser device which comprises a plurality of semiconductor regions comprising active layers optically coupled to one another and susceptible to undergo changes of gain upon injection of carriers, the plurality of semiconductor regions including an amplification region comprising an optical amplification active layer for emitting light in response to the injection of the carriers, a gain active layer for guiding the light emitted by the optical amplification active layer, and a DBR region having a distribution feedback structure for feeding back the light being guided, means for injecting the carriers into the plurality of semiconductor regions, and a resonator structure for amplifying the light of a specific wavelength of those emitted by the optical amplification active region by selective feedback through the feedback structure, wherein differential gain coefficient to the injected carrier density of the gain active layer is made different from the differential gain coefficient to the injected carrier density in the optical amplification active layer.

With the phrase "active layer" used herein, it is intended to mean a layer exhibiting a gain greater than unity "1" (one), which in turn means that the layer is active to the light of a certain wavelength and thus exhibits an amplification function. Reversely, when a gain of a layer is not greater than "1", this means that the layer is passive, and more specifically means that the intensity of light is constant without being caused to vary or that loss of light intensity is brought about by absorption. The semiconductor laser device according to the invention includes a number of the active layers in the sense mentioned above.

It is one of the features characterizing the present invention that the differential gain coefficient to a density of carriers injected is made different from one to another active layer. With the phrase "differential gain coefficient", it is intended to represent the magnitude of change in the gain to the magnitude of change in the density of carriers injected. By virtue of the different differential gain coefficients imparted to the active layers, respectively, it is possible to inhibit self-oscillation from occurring at least in one of the active layers. Difference in the differential gain coefficient between or among the active layers can be realized by using different semiconductor materials for forming the optically active layers or by varying composition of the compound semiconductors constituting the active layers or by varying the thickness of the active layers as typified by a quantum well structure. The difference in the differential gain coefficient results in difference in energy between electron and hole which are combined to emit light, i.e. a bandgap or difference in the energy state between the electrons and the holes within the active layer forming the quantum well structure. In the active layer of a small differential coefficient, the self-oscillation is suppressed. A region in which such an active layer is formed is used to serve as the DBR region.

In the semiconductor laser device according to the present invention, the plurality of active layers, i.e. the optical amplification layer and the gain active layer are optically coupled directly or indirectly through the medium of other interposed (active or passive [having a gain not greater than unity]) waveguide layer. Light emitted by the optical amplification layer travels through the gain active layer to enter a resonator constituted through cooperation of the optical amplification layer and the gain active layer to be amplified within the resonator. The oscillation wavelength selected and amplified by the resonator is variable by varying the effective resonator length. In view of the fact that the effective resonator length, i.e. optical path length has to be so established that the distance between edges of the resonator or distance between the edge and a distributed feedback structure described hereinafter satisfies the phase condition of light being transferred (traveling reciprocatively) within the resonator, it is preferred to make variable the refractive index of the guide layer mentioned above. The region to serve for such phase control or adjustment is provided with an electrode so that carriers can be injected into this region independently. It is not necessarily required to provide such phase control region between the optical amplification active layer and the gain active layer. It is sufficient to implement the phase control function in a region in which light travels within the resonator structure described above.

The semiconductor laser oscillation wavelength can be set or established by varying the refractive index internally of the resonator at a local region which may be realized in a distributed feedback structure implemented in a region where light is distributed. The distributed feedback structure is generally constituted by a first semiconductor having a diffraction grating formed therein and a second semiconductor having a refractive index differing from that of the first semiconductor and stacked thereon so as to realize a periodic distribution of the refractive index.

According to another aspect of the invention, there is provided a semiconductor laser device which comprises a plurality of active layers exhibiting different gain peak wavelengths, and a resonator structure for amplifying and oscillating light having a specific wavelength differing from the gain peak wavelengths by selectively feeding back the light of the specific wavelength. Thus, one of the features characterizing the invention is seen in that the oscillation wavelength is set with a deviation from the wavelength at which the gain of the active layer is maximum (this wavelength is also referred to as the gain peak wavelength).

According to a still further aspect of the invention, there is provided a semiconductor laser device which comprises a plurality of active regions including a plurality of active layers coupled optically and having gains susceptible to change upon injection of carriers, means for injecting the carriers into the plurality of the active regions, and a resonator structure for amplifying and oscillating light of a specific wavelength of those emitted by the active layers by selectively feeding back the light of the specific wavelength, wherein the plurality of the active layers compensate mutually for variations in the refractive index induced by the change of the carrier density.

For realizing the mutual compensation, the plurality of the active layers are imparted with different gain peak wavelengths. By setting the oscillation wavelength between these peak gain wavelengths, the change of refractive index brought about by the change in the carrier density can be cancelled out through cooperation of the plural active layers, whereby the wavelength chirping can be reduced.

In any of the structures described above, at least one of the plural active layers should be disposed in the vicinity of the diffraction grating (distributed feedback structure) for thereby preventing loss from occurring in the grating portion. In this conjunction, with the phrase "disposition in the vicinity of", it is to be understood that the active layer of concern and the diffraction grating are disposed in parallel and overlapping each other.

Further, according to still another aspect of the invention, there is provided a semiconductor laser device in which a material capable of exhibiting the gain peak wavelength shorter than the oscillation wavelength is used for forming the DBR region with a view to suppressing the gain of the DBR region from being increased by the carrier injection.

One advantage of the present invention is that notwithstanding of the use of an active material for forming the DBR region, there can be realized sufficient magnitude of change of the refractive index for protecting the wavelength-tunable width or range against being narrowed by the self-oscillation, while preventing oscillation threshold in the optical amplification region from being increased.

Another advantage of the present invention is that an active layer structure can be adopted in the phase control region for the purpose of suppressing the absorption loss which may occur when the passive optical waveguide is employed in the phase control region while preventing the oscillation threshold current from being increased. In this manner, loss can be prevented from being increased by the injection of current into the phase control region, and thus the change in the refractive index brought about by the current injection in the phase control region can effectively maximized, whereby there can be provided a semiconductor laser device enjoying a broad wavelength-tunable width (range) without suffering any significant fluctuation in the spectral line width and the light output.

Another advantage of the present invention is that the wavelength chirping taking place upon direct modulation of the semiconductor laser can be reduced, whereby optical communication can be realized at a high speed over an extended distance even when an optical fiber exhibiting not a less wavelength dispersion is employed.

Another advantage of the present invention is that a significant change in the refractive index can be realized with a small change of the gain (or gain absorption).

Another advantage of the present invention is that the phase and optical path length can be changed without being accompanied with variation of the light output power, whereby miniaturization of the optical device and remarkable improvement in the characteristics of the phase control region can be attained.

Still another advantage of the invention is that a signal-mode semiconductor laser which has a broad wavelength-tunable width (range) and oscillation output less susceptible to variation due to change of the oscillation wavelength can be realized.

Another advantage of the present invention is that the multiplexed number and hence the transmission capacity can be significantly increased by using the semiconductor laser device according to the invention as a light source for a wavelength-multiplexed coherent communication.

Still further advantages of the present invention will be apparent to those of ordinary skill in the art upon reading and understanding the following detailed description of the preferred embodiments.

BRIEF DESCRIPTION OF THE DRAWINGS

The invention may be implemented by various parts and arrangements or combinations of parts. The drawings are only for the purpose of illustrating the preferred embodiments of the invention and are not to be construed as limiting the invention. In the drawings;

FIG. 1 is a vertical sectional view of a semiconductor laser device according to an exemplary embodiment of the present invention;

FIGS. 9A, 9B, 10A, 10B, 11, 12 views showing semiconductor laser devices according to further embodiments of the invention, respectively;

FIGS. 19A to 19F views for illustrating a process for a semiconductor laser device to yet another embodiment of the present invention.

DESCRIPTION OF THE PREFERRED EMBODIMENTS

Figure 2A:
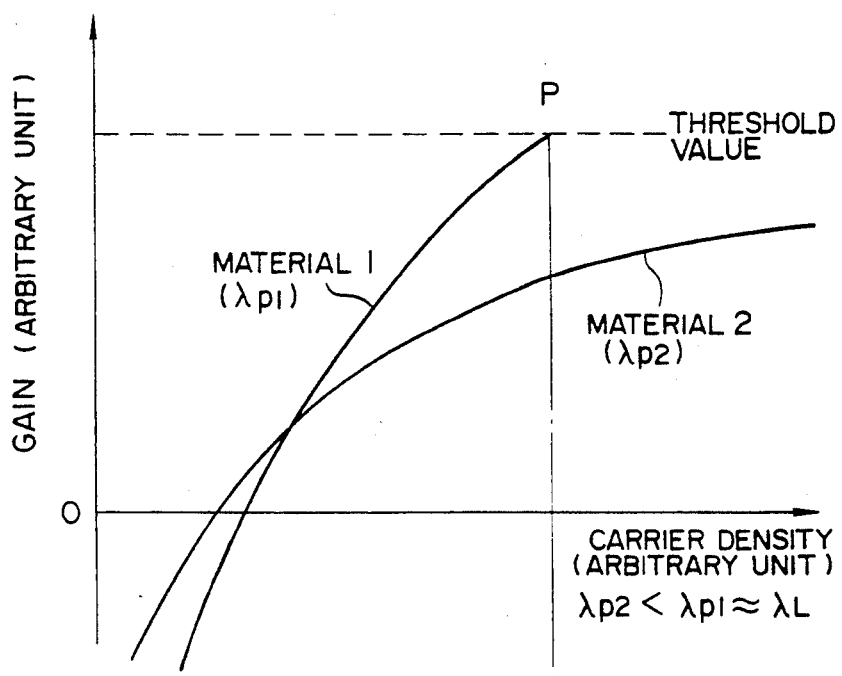
FIGS. 2A and 2B are views for illustrating changes of gain and index relative to the carrier density in an active optical waveguide.
Figure 2B:
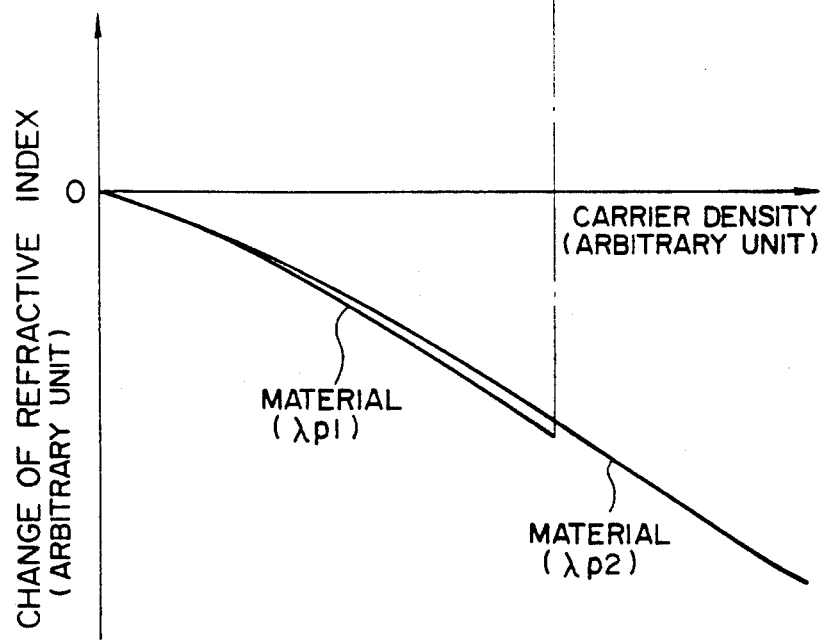

First, one of the principles underlying the present invention will be described by reference to the accompanying drawings and more particularly to FIG. 1 which shows a structure of a wavelength-tunable laser to which the invention is applied, together with FIGS. 2A and 2B which are views for graphically illustrating changes of gain and refractive index, respectively, of an active region constituting the part of the wavelength-tunable laser shown in FIG. 1.

The semiconductor laser device shown in FIG. 1 comprises a distributed Bragg (DBR) region 101 including an active optical waveguide 141 having a first active layer which is so formed on a substrate 106 as to be in contact with a diffraction grating 112, a phase control region 102 including an optical waveguide 181 formed of a passive material and having a refractive index which decreases as the density of injected carriers is increased, and an optical amplification region 103 including an active optical waveguide 105 having a second active layer structure, wherein each of the three regions 101, 102 and 103 mentioned above is realized, for example, by a p-i-n junction, being sandwiched between the n-type substrate 106 and a p-type cladding layer 107. The semiconductor laser further comprises independent electrodes 121, 122 and 123 formed on the cladding layer 107 and a common electrode 124 of the polarity opposite to that of the independent electrodes.

In the semiconductor laser, a resonator is formed by reflection from the diffraction grating in the DBR region 101 and reflection from an edge 120 of the optical amplification region 103, wherein laser oscillation takes place upon injection of a current into the optical amplification region 103 through the electrode 123 with a large gain. The oscillation wavelength is determined by a wavelength within a Bragg reflection wavelength range of the DBR region 101 and a wavelength whose phase satisfies the condition of an integral multiple of $2\pi$ upon traveling one round within the resonator.

Reviewing again the semiconductor laser device disclosed in JP-A-64-49293 cited hereinbefore by reference to FIG. 1, the active optical waveguide 105 of the optical amplification region 103 exhibiting a large gain for the injected current has been used as the active waveguide 141 of the DBR region 101. In conjunction with this prior art structure, there are illustrated in FIGS. 2A and 2B relations between the carrier density and the gain and the change of the refractive index. The wavelength $\lambda_{Pl}$ for the gain peak of the active material is so selected as to coincide approximately with the laser oscillation wavlength $\lambda_L$. As a consequence, the gain for the carrier injection at the laser oscillation wavelength $\lambda_L$ increases rapidly. Thus, a self-oscillation takes place in the DBR region 1. In other words, the semiconductor laser operates like a distributed feedback (DFB) type laser. As a result, the carrier density is fixed at a point P shown in FIG. 2A, whereby the change of the refractive index undergoes limitation (see the curve $\lambda_{Pl}$).

In contrast, when the active layer which differs from the active waveguide 105 of the optical amplification region 103 in respect to the change of gain (differential gain coefficient) for the injected carrier density is used as the active optical waveguide 141 of the DBR region 101, the change of refractive index can avoid the limitation by the self-oscillation, and besides the loss produced in the passive phase control region can be compensated for. By virtue of these features, there is made available a wide wavelength-tunable width without increasing the threshold current for oscillation of the optical amplification region. In implementation of such a structure, a material capable of emitting the wavelength $\lambda_{P2}$ at the gain peak which is shorter than the laser oscillation wavelength may be employed for the active waveguide 141, by way of example. Relations between the carrier density and the gain and the change of refractive index for the optical waveguide formed of the above-mentioned material are also illustrated in FIGS. 2A and 2B. With the material emitting the shorter wavelength $\lambda_{P2}$ at the gain peak, the wavelength $\lambda_{P2}$ does not coincide with the laser oscillation wavelength $\lambda_L$, whereby there can be realized a gentle gain slope. Consequently, even when the carrier density (injection current) is increased, increasing of photon density accompanying the increasing in the carrier density can be suppressed and at the same time the decrease of the carrier density accompanying the simulated emission which depends on the photon density can be suppressed, to thereby allow the carrier density to be increased. Thus, the gain at which the DBR region 101 is capable of a self-oscillation can not be reached. Consequently, the carrier density bringing about the change of refractive index is not fixed but can be made use of effectively. Since the change of refractive index brought about by the change of carrier density is only gently as a function of the wavelength, the change of refractive index brought about by the change of the carrier density at the laser oscillation wavelength $\lambda_L$ of the material emitting the shorter wavelength $\lambda_{P2}$ at the gain peak can assume the substantially same value as that of the first active layer, although lower than the latter more or less. Thus, it is possible to increase the wavelength-tunable width and in particular the Bragg reflection wavelength-tunable width.

As will be appreciated from the above description, it is possible to obtain broader wavelength-tunable characteristics while suppressing the oscillation threshold current from being increased in the optical amplification region 101 by making smaller the gain of the DBR region for a carrier density than that of the optical amplification region.

For the phase control, a current is injected in the phase control region 102 to thereby match or align the phase with the axial-mode resonance condition for the laser light between the Bragg reflection region and the cleavage edge 120, whereby the oscillation wavelength can be continuously shifted over a wide wavelength range in the single-mode state. Further, since the change of gain as a function of the change in the injected carrier density is flattened, there can be obtained an advantageous effect that the change in the emission power occurring upon shifting the oscillation wavelength can be noticeably suppressed.

Further, by employing such a material for the active optical wavelength 105 constituting the optical amplification region 103 which can have a longer gain peak wavelength than the oscillation wavelength, the oscillation wavelength can be detuned to be shorter than the gain peak wavelength. By virtue of such detuning, the ratio between the change of the refractive index which accompanies fluctuation of the carrier density and change of the gain, i.e. a so-called α-parameter can be reduced, as a result of which the spectral line width is diminished, to an advantageous effect.

Figure 3:
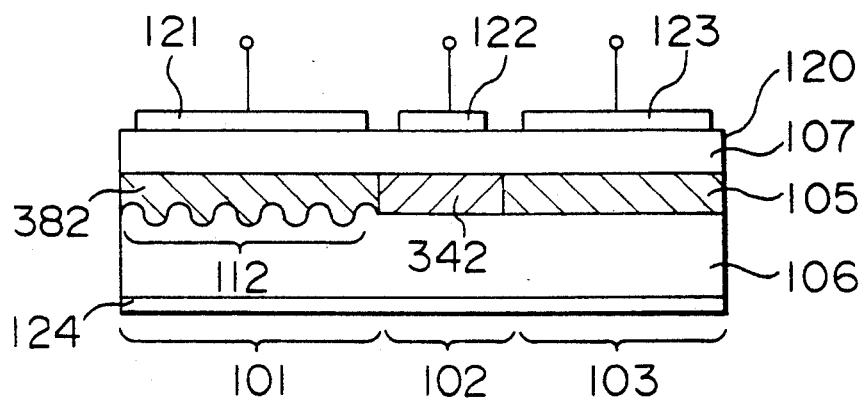
FIG. 3 is a vertical sectional view showing a structure of a wavelength-tunable semiconductor laser device to which the present invention is applied.
Figure 4:
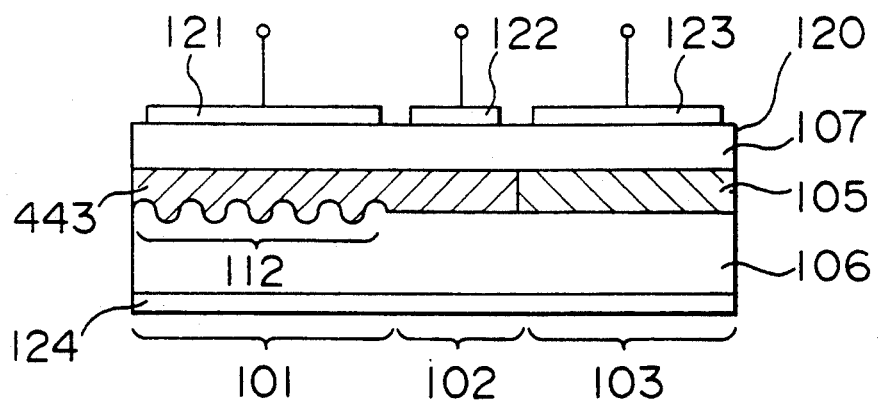
FIG. 4 is a vertical sectional view of a semiconductor laser device implemented in another structure.

Now, another one of the principles underlying the present invention will be described by reference to FIG. 3 in which same reference symbols are used for designating like constituents as those shown in FIG. 1, (being understood that the same applies true throughout several figures referred to in the description which follows). In the semiconductor laser structure shown in FIG. 3, the structure of the DBR region and the optical waveguide structure of the phase control region shown in FIG. 1 are mutually replaced such that a passive optical waveguide 382 having a refractive index which is decreased upon injection of carriers is used in the DBR regions with a second active optical waveguide 342 being used in the phase control region 102. With this structure, increasing of the absorption loss observed heretofore in the passive phase control region as a result of increasing in the carriers can positively be prevented. To this end, however, it is required to make greater the ratio between the change of refractive index of the phase control region 102 and the change of gain (i.e. refractive index change/gain change ratio) than that of the optical amplification region 103. Besides, due to the combination with the passive DBR region, the loss taking place in the DBR region can be canceled out by a gain obtained in the phase control region 102, whereby the oscillation threshold of the optical amplification region 103 is prevented from increasing.

Further, when an optical waveguide 433 having a rate of change of the refractive index substantially equal to that of the optical waveguide 141 shown in FIG. 1 is employed for the phase control region 102 in addition to that for the DBR region 101, the threshold current is prevented from increasing, whereby the self-oscillation of the DBR region 101 can be eliminated as well. This characteristic can be realized by selecting the material 433 such that the gain peak wavelength $\lambda_{P2}$ becomes shorter.

As described above, the active optical waveguide exhibiting the gain peak wavelength lying on a short wavelength side relative to the laser oscillation wavelength is employed for the DBR region and/or for the phase control region. This structure can be realized by making the composition of the waveguide differ from that of the amplification region. As an alternative, the thickness of the active waveguide may be made smaller than that of the amplification region. In the latter case, the gain peak wavelength is shifted toward the shorter wavelength side, as the carrier density is increased, whereby the peak wavelength can be made shorter than the laser oscillation wavelength. Besides, by implementing the active optical waveguide in a multi-layer structure including an optical guide layer and an active layer having a thickness smaller than that of the former, a part of the injected carriers leaks into the optical guide layer, as a result of which the self-oscillation of the DBR region is suppressed while allowing the refractive index to change noticeably.

Thus, according to the teaching of the invention described above, the self-oscillation of the distributed Bragg reflection (DBR) region can be suppressed regardless of the current injection into the active layer either by realizing the DBR region in the structure differing from that of the optical amplification region and employing for the DBR region the active layer which can assure a significant change in the refractive index substantially to the same extent as the active layer exhibiting the gain peak close to the oscillation wavelength notwithstanding of a small gain or alternatively by employing for the phase control region the active layer structure which exhibits a smaller gain for the injected current than the optical amplification region and which can ensure more significant change in the refractive index.

The other principle of the invention will be described by reference to FIG. 11. In order to reduce the chirping in wavelength, it is required that a plurality of regions provided in the semiconductor laser resonator (cavity) cooperate mutually to compensate for fluctuation of chirping in the wavelength. FIG. 11 shows an example of a structure which can satisfy the above requirement. Referring to the figure, there are provided in the vicinity of a diffraction grating 1112 (on an optical guide layer 1113) active layers 1104 and 1105 having mutually different compositions so that the regions 1104 and 1105 differ from each other in respect to the gain peak wavelength. A pair of discrete electrodes 1108 and 1109 are provided on a cap layer 1118 for injecting carriers into the regions 1104 and 1105 separately. The different gain peak wavelengths result in difference in the carrier density dependence of the gain (differential gain) at the laser oscillation wavelength. Upon occurrence of the laser oscillation in this semiconductor laser device in response to application of current pulse, the carrier density changes at different rates in the individual regions. Thus, although the carrier density is certainly decreased by the stimulated emission brought about by the laser oscillation, the laser light intensity is prevented from increasing excessively owing to a remarkable change of the gain in the region having a large differential gain, while the laser light intensity is protected against excessive attenuation due to a gentle change of the gain in the region having a small differential gain. In this manner, the rate of transient change in the carrier density can be made low. Although the refractive index depends on the carrier density, it is an average refractive index of the whole device that determines the laser oscillation wavelength. Thus, according to the principle described above, the magnitude of fluctuation in the oscillation wavelength, i.e. the wavelength chirping can be diminished with the laser structure shown in FIG. 11 by virtue of smaller change in the carrier density on an average.

In order to set the gain peak wavelengths such that they assume spatially different values, there may be conceived several methods, some of which will be mentioned below. First, by varying the composition of the active layers in dependence on the positions thereof within the resonator or by varying the thickness from one to another active layers, the gain peak wavelengths are changed by taking advantage of the band filling effect of the carriers. Further, the regions differing from one another in the gain peak wavelength may be disposed in cascade in the direction of the optical axis or in parallel so far as they are located within the range of light intensity profile. The laser oscillation wavelength should preferably be set intermediate between the different gain peak wavelengths, because then the difference in the differential gain can be used very effectively.

As will be appreciated from the foregoing description, the regions mutually differing in the gain peak wavelength in the semiconductor laser device also differ from one another in the differential gain for the laser oscillation wavelength. By virtue of this difference in the differential gain, variation in the refractive index is suppressed.

On the principle, each of the regions may assume the gain state or loss state at the laser oscillation wavelength. However, excessively high loss in the loss state involves increasing in the threshold current as well as degradation in the high-speed characteristics. Accordingly, the region should preferably be set to the state at least close to the gain state.

In order to make the most of the difference in the differential gain, the period of the diffraction grating should desirably be dimensioned such that the wavelength determined thereby lies intermediate between the gain peak wavelengths of the individual regions.

In connection with magnitude of difference in the gain peak wavelength, it should be mentioned that too small difference can not bring about the aimed effect, while excessively large difference involves a noticeable loss in one of the regions at the laser oscillation wavelength, involving an increase in the threshold current. Under the circumstances, the wavelength difference mentioned above should preferably be selected in a range of 5 nm to 100 nm and more preferably in a range of 10 nm to 50 nm.

It is thus apparent that the chirping in the wavelength can be reduced by providing within the resonator a plurality of regions differing from one another in respect to the gain peak wavelength or the gain slope for the injected carrier density.

Now, the present invention will be described in greater detail in conjunction with preferred or exemplary embodiments thereof.

Embodiment 1

Figure 5A:
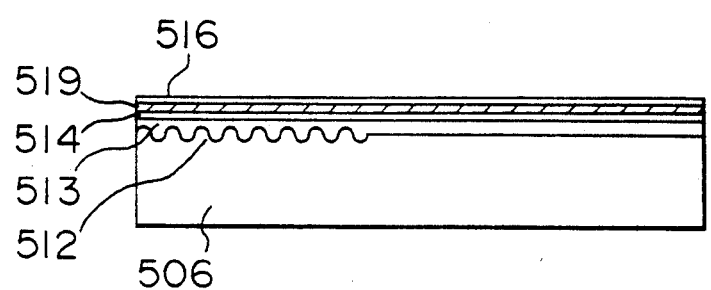
FIGS. 5A to 5F are vertical sectional views for illustrate a man process of semiconductor device according to the present invention.
Figure 5B:
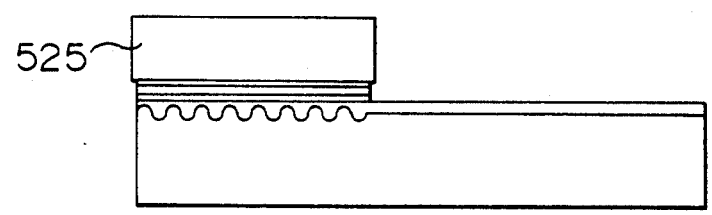
Figure 5C:
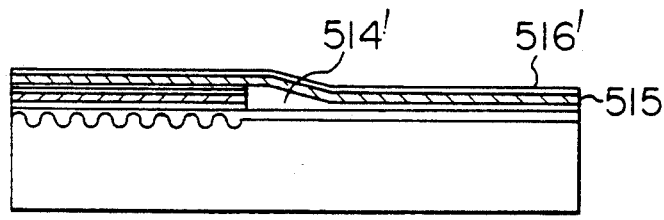
Figure 5D:
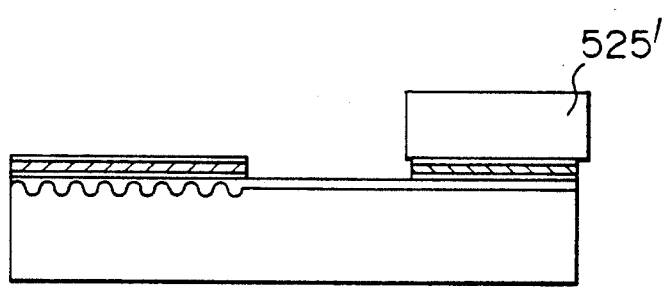
Figure 5E:
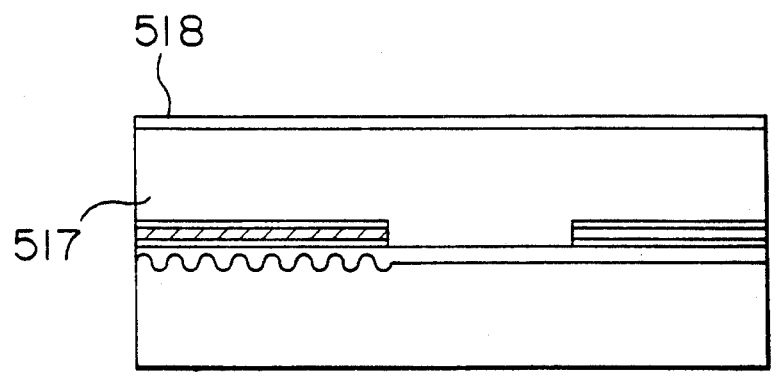
Figure 5F:
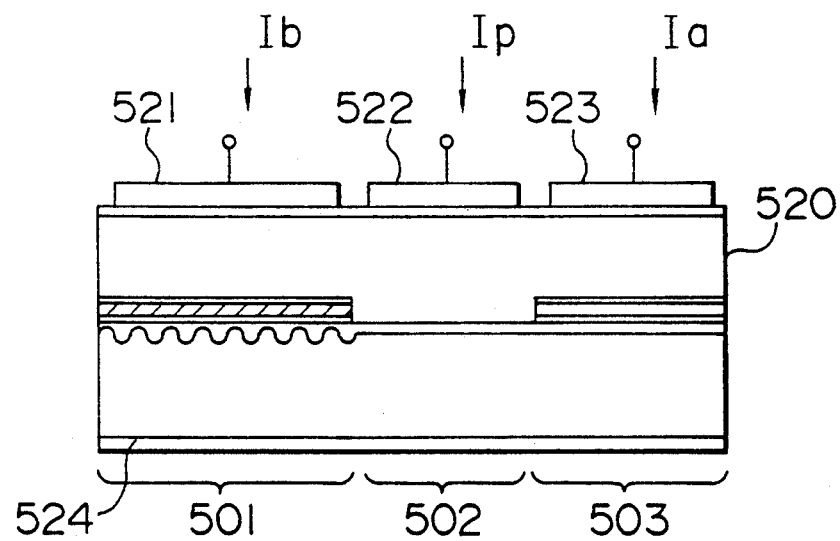

FIG. 5F shows a structure of a semiconductor laser device according to a first exemplary embodiment of the invention in a sectional view taken along the optical axis. A process for manufacturing this semiconductor laser device will be described below by reference to FIGS. 5A to 5F. At first, a diffraction grating 512 (having a pitch of 240 nm) is formed partially or locally on an n-type InP-substrate 506, whereon there are formed sequentially through crystal growth process an n-type InGaAsP-guide layer 513 (exhibiting a gain peak wavelength $\lambda_P$ of 1.3 μm), an n-type InP-stopping layer 514, an i-type InGaAsP-active layer 519 exhibiting a gain peak wavelength $\lambda_P$ shorter than the oscillation wavelength (i.e. $\lambda_P$ in a range of 1.50 to 1.53 μm), and an i-type InGaAsP-antimeltback layer 516 (exhibiting a gain peak wavelength $\lambda_P$ of 1.3 μm), as shown in FIG. 5A, wherein the values of the gain peak wavelengths $\lambda_p$ mentioned above are measured in the vicinity of the oscillation threshold currents in the respective materials. Next, a portion having the grating 512 is masked with a photoresist 525, whereon the antimeltback layer 516, the active layer 519 and the stopping layer 514 in the other portion are selectively etched by etchants appropriate to these layers, respectively, with the guide layer 513 being left as it is (FIG. 5B). After removing the photo-resist layer 525, the InP-stopping layer 514', the InGaAsP-active layer 515 having the gain peak wavelength in the vicinity of the oscillation wavelength (i.e. $\lambda_P = 1.55$ μm) and the InGaAsP-antimeltback layer 516' ($\lambda_P = 1.3$ μm) are sequentially grown through crystal growth process (FIG. 5C). Next, a portion destined to constitute an optical amplification region is protected by a photoresist 525', whereon the antimeltback layer 516', the active layer 515 and the stopping layer 514' in the other portion are selectively etched by etchants appropriate to these layers, respectively (FIG. 5D). After removing the photoresist 525', a p-type cladding layer 517, and a p+-type InGaAsP-cap layer 518 ($\lambda_P = 1.15$ μm) are sequentially grown (FIG. 5E), being then followed by formation of waveguide stripe, burying crystal growth and others. Finally, p-type discrete electrodes 521, 522 and 523 are formed on the surfaces of a DBR region 501, a phase control region 502 and an optical amplification region 503, respectively, while an n-type electrode is formed over the lower surface of the substrate 506, as shown in FIG. 5F.

It should be mentioned that the semiconductor laser device of a structure similar to that described above may also be manufactured by using insulation films such as of $SiO_2$ or the like in the crystal growth process. More specifically, there are formed on the substrate 506 having the diffraction grating 512 deposited thereon the guide layer 513, the stopping layer 514, the active layer 519 and the antimeltback layer 516 of the DBR region 501 mentioned above through epitaxial growth process. Thereafter, the active DBR region 501 is protected by a $SiO_2$-mask, whereon the phase control region 502 and the optical amplification region 503 are selectively etched away until the InP-stopping layer 514 is reached. Subsequently, the multi-layer film for the active optical waveguide in the optical amplification region 503, i.e. the multi-layer film including the i-type InGaAsP-active layer 515 ($\lambda_P = 1.55$ [m] and the i-type InGaAsP-antimeltback layer 516'($\lambda_P = 1.3$ μm) is formed through epitaxial growth. Since the active DBR region 1 is protected by the $SiO_2$-mask at that time, only the phase control region 502 and the optical amplification region 503 are allowed to selectively grow epitaxially. subsequently, the active DBR region 501 and the optical amplification region 503 are protected by the $SiO_2$-mask to etch away selectively the phase control region 502 until the InP-stopping layer 514 is reached. After removing the $SiO_2$-mask, the p-type InP-layer 517 and the P+-type cap layer 518 are grown epitaxially, which is then followed by mesa-etching and burying epitaxial growth to thereby form a buried hetero-structure. Finally, a p-type electrode layer is deposited by evaporation and then separated into the electrode 521 for the active DBR region, the electrode 522 for the phase control region and the electrode 523 for the optical amplification region 523. Finally, the n-type electrode 524 is formed over the lower surface of the substrate.

It should be mentioned that the first mentioned method is advantageous over the second mentioned method in that the surface resulting from the crystal growth is more smooth because there is no need for covering the regions not to be grown by the insulation film in the epitaxial growth process.

Next, description is directed to operation of the semiconductor laser device according to the instant embodiment.

The condition for the laser oscillation resides in that the gain internally of the laser is so balanced that the intensity of light making a round trip within the laser coincides with the original intensity and that the phase of light making the one round trip is given by an integral multiple of $2\pi$. In the case of the semiconductor laser device of the structure described above, when the gain of light due to the current $I_a$ injected into the optical amplification region 503, the attenuation due to absorption by the free carriers ascribable to the injected current $I_P$ in the phase control region 502, the gain due to the injected current $I_b$ in the DBR region and the loss in the quantity of light upon leaving the laser are balanced with an overall gain of unity (one), then oscillation takes place at a wavelength for which a sum of the phase of reflection in the active DBR region 501 as viewed from the phase control region 502, the phase of propagation in the phase control region 502 and the optical amplification region 503 and the phase of reflection at the edge 520 of the optical amplification region 502 is given by an integral multiple of $2\pi$. When only the injection current to the active DBR region 501 is increased in the state in which the laser is oscillated by injecting a constant current to the optical amplification region 503, the Bragg wavelength is shifted about $-0.04$ nm/mA to the shorter wavelength side. Further, when only the current injected to the phase control region 502 is increased, the Bragg wavelength is also shifted about $-0.1$ nm/mA to the shorter wavelength side.

In this manner, when the current is injected into the phase control region 502 simultaneously with the current injection into the active DBR region 501 with a proper ratio to the injection current $I_b$ for the DBR region 501 (e.g. with a ratio of about $\frac{1}{2}$ for the values mentioned above) while maintaining constant the injection current $I_a$ to the optical amplification region 503, an optical path length control is so performed as to satisfy the oscillation phase condition for the shift of the Bragg wavelength.

Thus, it is possible to shift continuously the oscillation wavelength through current injections to the active DBR region 501 and the phase control region 502. Since the material employed for the active layer 519 constituting the active DBR region 501 exhibits the gain peak wavelength shorter than the oscillation wavelength in the case of the semiconductor laser according to the instant embodiment, increasing of the gain due to the current injection can be flattened, whereby a higher carrier density can be obtained with increase of the photon density being suppressed even in the region injected with a large current, thereby making it possible to shift the Bragg wavelength. Besides, because of little increase in the photon density, the oscillation power can be protected against any noticeable variation even when the oscillation wavelength is changed.

The characteristics of the wavelength-tunable semiconductor laser device of the structure described above is evaluated as follows. By controlling the current injected into the DBR region 501 and the phase control region 502 while supplying a constant current in a range of 100 mA to the optical amplification region 503, a continuously wavelength tunable width of 5 nm can be realized with the laser power of 10 mW emitted from the edge 520 of the optical amplification region 503. Even when the current injection to the DBR region 501 is increased, there occurs no clamping of the wavelength shift due to a self-oscillation of the DBR region 501. In the oscillation spectra, there exists no spectrum originating in the self-oscillation. Only the single spectrum formed by the edge 520 of the optical amplification region 503 and the DBR region 501 can be observed.

Embodiment 2

Figure 6:
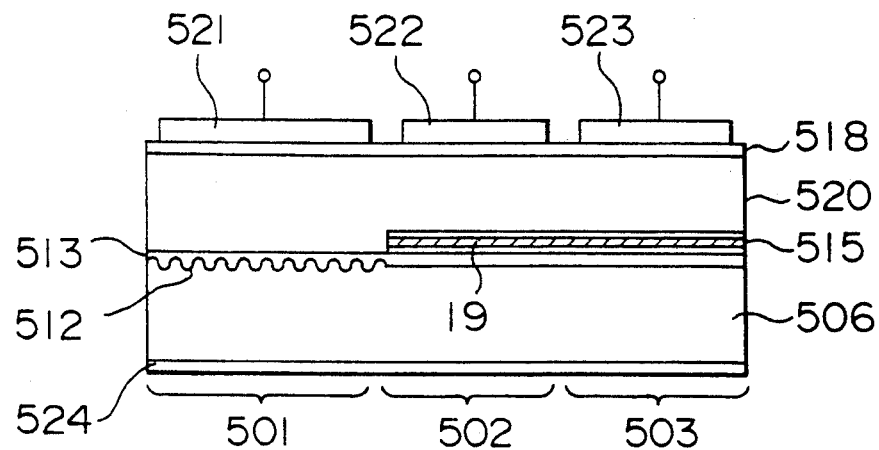
FIGS. 6 and 7 are sectional views showing semiconductor laser devices according to other embodiments of the invention, respectively.

As a dominant factor for increasing the oscillation threshold, there can be mentioned an increase in the absorption loss which accompanies the increase in the current injected to the phase control region formed of a passive material. The second embodiment of the invention is directed to a structure of the semiconductor laser in which a material exhibiting the gain peak at a shorter wavelength than the oscillation wavelength is employed for the phase control region. FIG. 6 shows a structure of the semiconductor laser device according to the second embodiment of the invention in a section taken along the optical axis. The manufacturing process of this laser device is substantially same as that for the laser according to the first embodiment described hereinbefore by reference to FIGS. 5A to 5F except for a difference in that at the step shown in FIG. 5B, the phase control region located intermediately is left in place of the multi-layer DBR region stacked first. Subsequently, through the succeeding steps similar to those in the first embodiment, there is realized the structure shown in FIG. 6.

The characteristics of the wavelength-tunable semiconductor laser according to the instant embodiment have been evaluated. By controlling the currents injected into the DBR region 501 and the phase control region 502 while maintaining constant at 100 mA the injection current to the optical amplification region 503, a continuously wavelength tunable width of 4.5 nm can be realzied characteristically. The laser power undergoes substantially no variation and can be maintained around 7 mW. This in turn means that the oscillation threshold scarcely changes.

Embodiment 3

Figure 7:
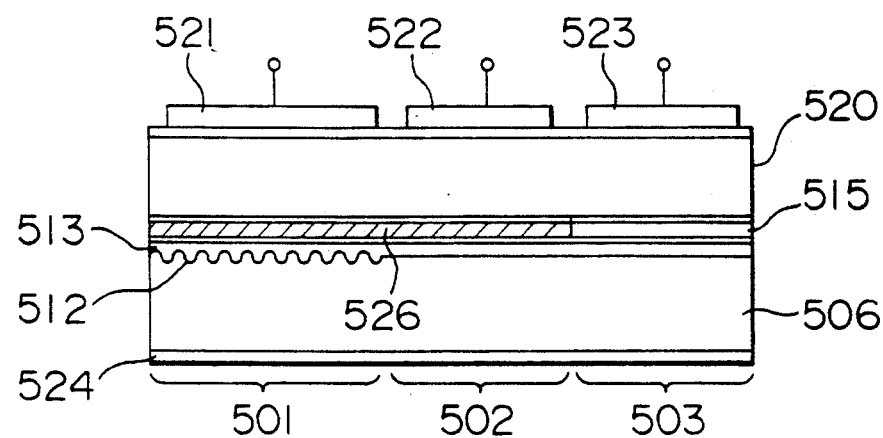
Figure 8:
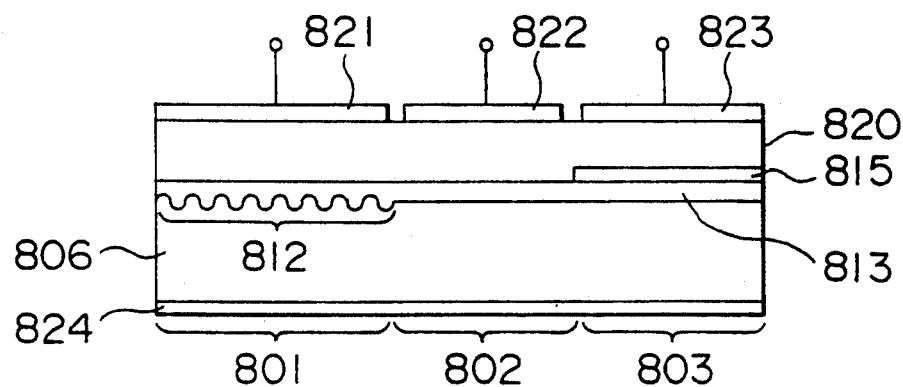
FIG. 8 is a sectional view showing conventional semiconductor laser devices.

Starting from the semiconductor laser structure according to the second embodiment, it is taught by the invention incarnated in the third embodiment to provide gain regions in the DBR region and the phase control region, respectively, for the purpose of suppressing occurrence of the absorption loss ascribable to the use of the passive material. FIG. 7 shows a structure of the wavelength-tunable semiconductor laser according to the third embodiment in a section taken along the optical axes. With the structure according to the instant embodiment, it is necessary to shift the gain peak wavelength to the shorter wavelength side relative to the laser wavelength, because there is no necessity for making up the absorption loss in the passive material, as in the case of the first and second embodiments. It is now assumed that the gain peak wavelength of the active layer 526 for the DBR region 501 and the phase control region 502 is 1.47 $\mu$m in the structure shown in FIG. 7. The process for manufacturing the semiconductor laser device according to the instant embodiment is substantially same as that in the first embodiment described hereinbefore by reference to FIGS. 5A to 5F except for difference in that at the step for forming first and multi-layer film (FIG. 5A), the active layer 519 exhibiting the peak gain wavelength $\lambda_P$ of 1.50 $\mu$m is replaced by an InGaAsP-active layer 525 ($\lambda_P = 1.47$ $\mu$m) and that at the etching process shown in FIG. 5B, both the DBR region 501 and the phase control region 502 are covered with a photoresist for removing the optical amplification region 502 to the top of the guide layer by etching.

Subsequent process steps are carried out in the same manner as in the case of the first embodiment.

According to the characteristics of the wavelength-tunable semiconductor laser realized in the structure described above, there can be realized a continuous wavelength-tunable width or range of 5 nm by controlling the currents injected into the DBR region 501 and the phase control region 502 while maintaining constant at 100 mA the current injected to the optical amplification region.

Embodiment 4

Figure 17A:
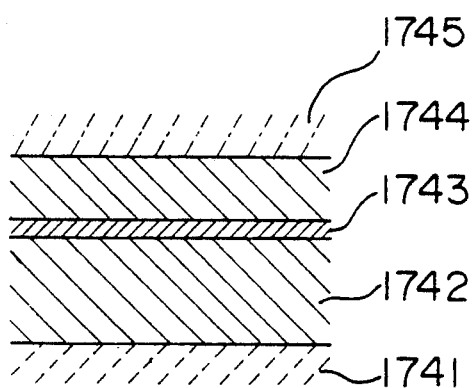
FIGS. 17A and 17B are views for illustrating optical waveguide a semiconductor laser device according to an exemplary embodiment of the invention and show a basic structure and energy band at the time of the carrier respectively.
Figure 17B:
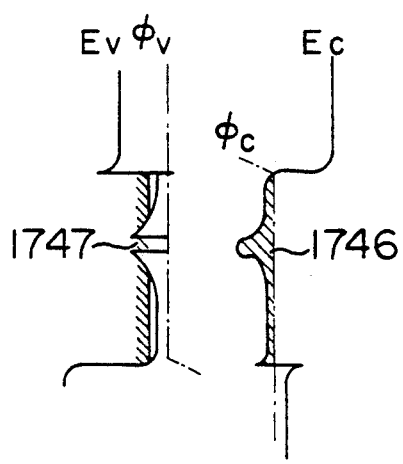
Figure 18:
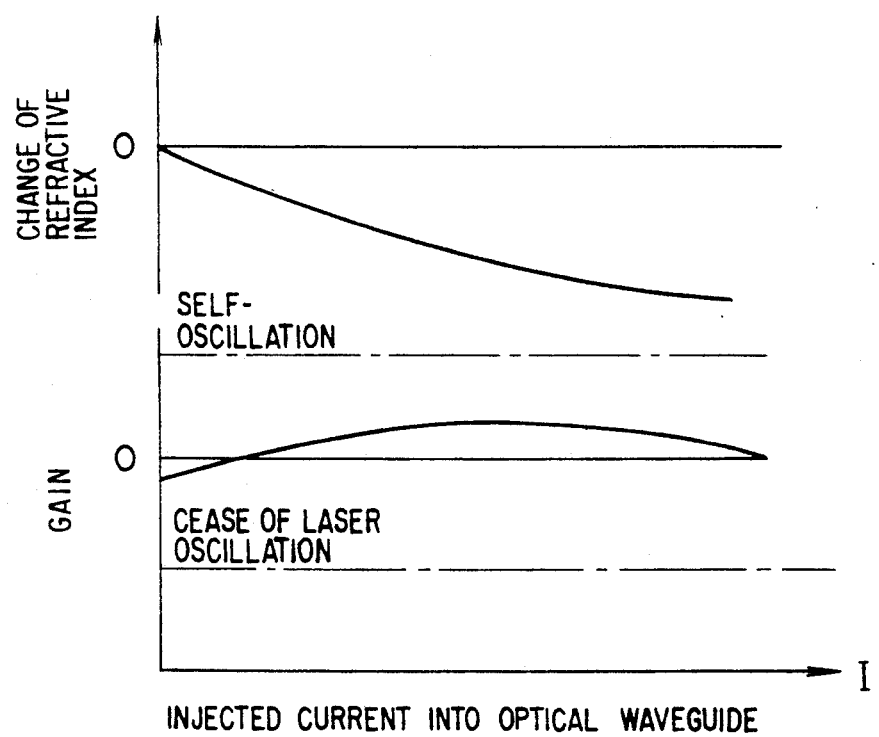
FIG. 18 is a view for illustrating changes of the gain and the refractive index in an optical waveguide of semiconductor laser device according to a further embodiment of the present invention.

The fourth embodiment of the invention is concerned with a structure of the wavelength-tunable semiconductor laser device in which an active layer capable of giving birth to a gain of such magnitude as to making up the absorption loss occurring upon injection of carriers in the passive guide layer is joined to the passive guide layer in the DBR region or the phase control region in parallel to the direction in which the light is guided. FIG. 17A is a sectional view showing a basic structure of the optical waveguide of the semiconductor laser device according to the fourth embodiment of the invention, and FIG. 17B is a view for illustrating an energy band at the time of carrier injection in the device according to the instant embodiment. Disposed as sandwiched between a p-type cladding layer 1745 and an n-type cladding layer 1741 are guide layers 1742 and 1744 of lower bandgap energy than the cladding layers, wherein an active layer 1743 of lowest bandgap energy is disposed as sandwiched between the guide layers 1742 and 1744. In this conjunction, it should however be noted that the provision of only one guide layer may also be sufficient. Basically, the semiconductor layer according to the instant embodiment is similar to a double hetero type semiconductor laser. A characteristic feature of the semiconductor laser according to this embodiment is seen in that the thickness of the active layer 1743 is diminished while increasing the thickness of the guide layers 1742 and 1744. In an ordinary semiconductor laser having oscillation wavelength of 1.55 $\mu$m, the active layer is imparted with a thickness not smaller than 0.1 $\mu$m in order to obtain oscillation gain. Consequently, in the case of the ordinary semiconductor laser having the thick active layer 1743 as mentioned above, the current injected is transformed to carrier electrons 1746 and carrier holes 1747. On the other hand, substantially all of the carriers injected remain within the aforementioned active layer 1743 and scarcely overflow to the guide layers 1742 and 1744. The thickness of the active layer which exceeds 1/15 of the wavelength, as described above, leads to the laser oscillation. Under the circumstance, the thickness of the active layer is selected smaller than 1/15 of the wavelength intended for use, while that of the passive guide layer is selected to be larger than 1/15 of the wavelength. In FIG. 17B, a reference symbol $E_c$ represents conduction band edge energy, $E_v$ represents valence band edge energy, $\phi_v$ represents hole energy and $\phi_c$ represents electron energy. Further, hatched areas indicate regions in which electrons are present.

By dimensioning the thickness of the active layer not greater than 0.07 $\mu$m (=1/15 of the wavelength for use) with the thickness of the guide layer being not smaller than 0.15 $\mu$m, that portion of the waveguide which is occupied by the active layer 1743 is reduced, whereby the gain of the waveguide is decreased to an extent effective for suppressing the self-oscillation. Further, because of thickness of the active layer 1743, the injected carriers can overflow to the guide layers 1742 and 1744. As a result of this, the refractive indexes of the guide layers 1742 and 1744 are forced to change, and at the same time the carriers are absorbed by the guide layers 1742 and 1744 mentioned above, which in turn is effective for further suppressing the self-oscillation. In this way, by placing the thin active layer in contact with the passive guide layers 1742 and 1744, the self-oscillation can be suppressed with less change of the gain for the injection of carriers. On the other hand, the absorption of carriers by the guide layers can not lead to the cease of oscillation. Consequently, the significant change in the refractive indexes brought about by the injection of carriers into the active layer 1743 and the guide layers 1742 and 1744 can be made use of to a possible maximum. In this manner, there can be realized a greater wavelength tunable width or range without deteriorating the characteristics of the wavelength-tunable laser.

When such a material is employed for the active layer which has a shorter gain peak wavelength than the oscillation wavelength, the gain can be suppressed to 30 $cm^{-1}$ or less. Thus, in this case, the self-oscillation can be suppressed while allowing greater refractive index to be obtained, even when the active layer has a thickness greater than 0.07 $\mu$m inclusive.

Figure 9A:
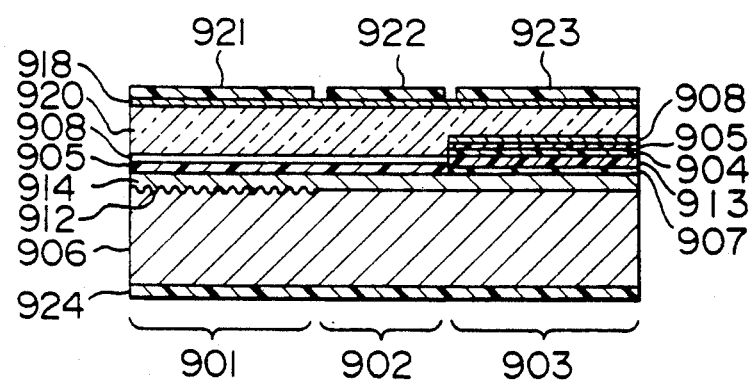
Figure 9B:
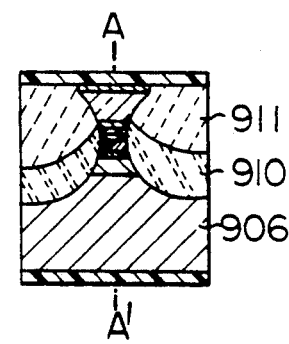

Now, description will be made in detail of the semiconductor laser according to the instant embodiment by referring to FIGS. 9A and 9B, in which FIG. 9A shows a vertical sectional view of the same taken along the line A—A' in FIG. 9B which shows a cross-sectional view. A diffraction grating 912 is formed locally on an n-type InP-substrate 906. Subsequently, there are formed sequentially an InGaAsP-guide layer 914 exhibiting a bandgap wavelength $\lambda_P$ of 1.3 $\mu$m in a thickness of 0.2 $\mu$m, an n-type InP-stopping layer 907 in a thickness of 0.03 $\mu$m, an InGaAsP-active layer 913 having $\lambda_P$ of 1.55 $\mu$m in a thickness of 0.10 $\mu$m, and an InGaAs-antimeltback layer 904 having $\lambda_P$ of 1.3 $\mu$m in a thickness of 0.04 $\mu$m through crystal growth process. Thereafter, the regions 901 and 902 exclusive of the optical amplification region 903 are etched till the stopping layer 907. Then, there are formed over the whole surface an InGaAsP-active layer 905 having $\lambda_P$ of 1.55 $\mu$m in a thickness of 0.05 $\mu$m, an antimeltback layer 908 in a thickness of 0.04 $\mu$m, a p-type InP-cladding layer 920 in a thickness of 2 $\mu$m, and an InGaAsP-cap layer 918 having $\lambda_P$ of 1.15 $\mu$m in a thickness of 0.5 $\mu$m through crystal growth process. Next, mesa reversal etching is performed to an extent that the active layer remain in a width of about 1 $\mu$m (FIG. 9B). Thereafter, a p-type InP-layer 910, an n-type InP-burying layer 911, p-type electrodes 921, 922 and 923 and an n-type electrode 924 are formed. The p-type electrodes are provided separately for the diffraction grating region 901, the phase control region 902 and the optical amplification region 903, respectively.

With the structure of the semiconductor laser described above, increasing of the current injected into the diffraction grating region 901 does not result in occurrence of the self-oscillation. The characteristic evaluation shows that the gain is not greater than 30 $cm^{-1}$. A continuously tunable wavelength width of 4 nm can be obtained for the oscillation wavelength.

Embodiment 5

The semiconductor laser according to this embodiment has a structure differing from that shown in FIG. 9 in respect that an InGaAsP-layer ($\lambda_P = 1.52$ μm) having a thickness of 0.06 μm is employed for the active layer of the diffraction grating region 901 and the phase control region 902. According to embodiment, the continuously tunable wavelength width is increased to 5 nm.

Embodiment 6

In the structure shown in FIG. 9, the active layer similar to that described hereinbefore in conjunction with the first embodiment is employed in a thickness of 0.06 μm with the guide layer being formed of an InGaAsP-layer ($\lambda_P = 1.38$ μ). According to the sixth embodiment, a continuously tunable wavelength width of 5 nm can be realized.

Embodiment 7

Figure 10A:
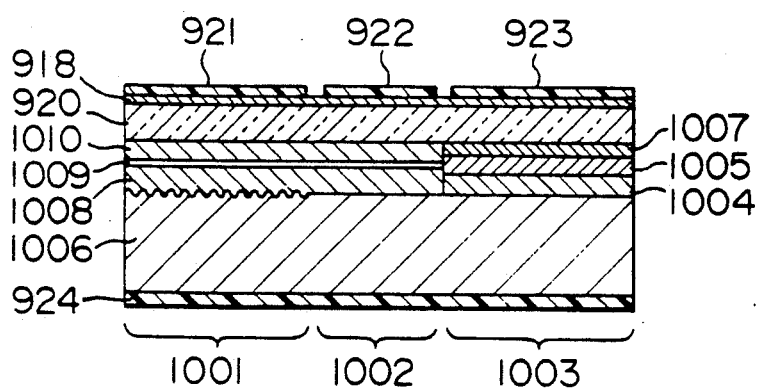
Figure 10B:
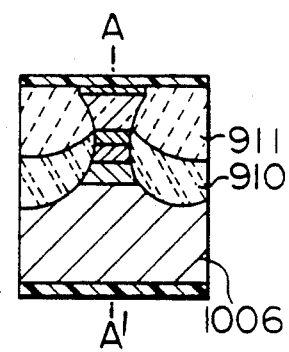

A seventh exemplary embodiment of the invention will be described by reference to FIG. 10. There are formed on a n-type InP-substrate 1006 through crystal growth process InGaAs-layers 1004, 1005 and 1007 having $\lambda_P$ of 1.3 μm, 1.55 μm and 1.3 μm, respectively, and in thicknesses of 0.10 μm, 0.15 μm and 0.05 μm, respectively. Thereafter, the regions 1001 and 1002 are removed by etching with optical amplification region 1003 being left as it is, whereon layers 1008, 1009 and 1010 having $\lambda_P$ of 1.3 μm, 1.55 μm and 1.3 μm are grown in thickness of 0.2 μm, 0.05 μm and 0.1 μm, respectively, through vapor phase growth. Subsequently, through the process steps corresponding to those described hereinbefore in conjunction with the fourth embodiment, the semiconductor laser of a structure shown in FIG. 10B is realized.

With the laser structure according to the instant embodiment, not only the continuously tunable wavelength width substantially equal to that of the first embodiment can be obtained but also a lower threshold current (i.e. current injected to the optical amplification region) can be achieved.

Embodiment 8

A three-electrode wavelength-tunable laser manufacturing method which differs from that described hereinbefore in conjunction with the first embodiment will be described by referring to FIGS. 19A to 19F.

Figure 19A:
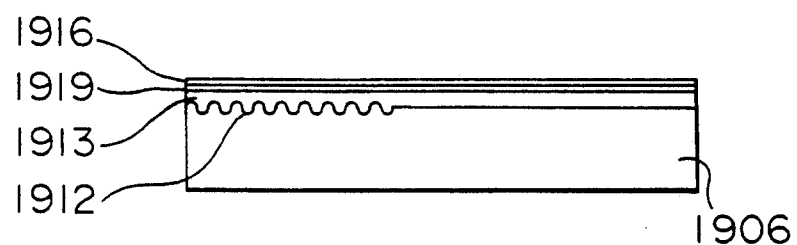
Figure 19B:
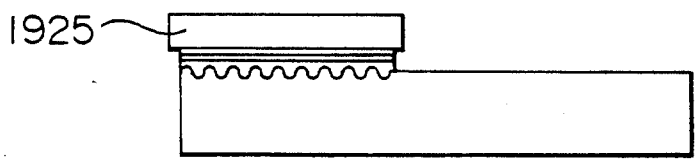
Figure 19C:
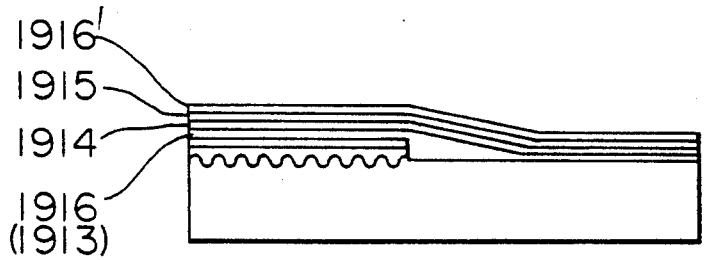
Figure 19D:
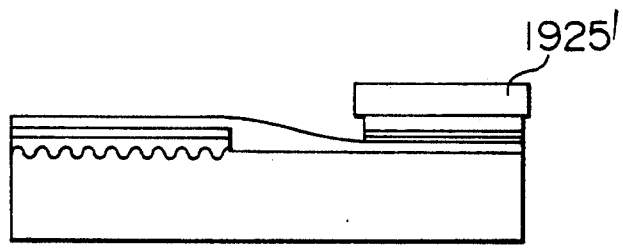

At first, there are formed on an n-type InP-substrate 1906 inscribed locally with a diffraction grating 1912 an n-type InGaAs-guide layer 1913 of $\lambda_P$ equal to 1.3 μm, an InGaAsP-active layer 1919 of $\lambda_P$ equal to 1.53 μm and an anti-meltback layer 1916 of $\lambda_P$ equal to 1.3 μm through epitaxial growth process (FIG. 19A). While protecting by a photoresist mask 1925 the region where the diffraction grating 1912 is provided, the other grown region are etched by using a selective liquid etchant containing $H_{2l}SO_4$, $H_2O_2$ and $H_2O$ (FIG. 19B).

Next, after having removed the photoresist mask 1925, an InGaAsP-layer (1916/1913) of $\lambda_P = 1.3$ serving an an anti-meltback layer and a guide layer, an InP-stopping layer 1914, an active layer 1915 of $\lambda_P$ equal to 1.55 μm and an anti-meltback layer 1916' are formed over the whole surface through epitaxial growth. Subsequently, a flat surface portion of the substrate surface 1906 is protected by a photoresist mask 1925', and then the anti-meltback layer 1916' and the active layer 1915 in the other regions are selectively etched by using the liquid etchant mentioned above. Further, only the InP-stopping layer 1914 is selectively etched by using a liquid etchant of $H_2PO_4/HCl$-series.

After the photoresist mask 1925' is removed, a p-type InP-cladding layer 1917 and a cap layer 1918 are formed through epitaxial growth (FIG. 19E). Finally, Zn is diffused into electrode junctions to thereby form a p-type electrode 1921 in the DBR region 1901, a p-type electrode 1922 in the phase control region and a p-type electrode 1923 in the optical amplification region 1903 while an n-type electrode 1924 is formed over the rear surface of the substrate (FIG. 19).

According to the manufacturing method described above, no measures are taken for covering the region not to be grown in the epitaxial growth process. By virtue of this feature, the surface resulting from the crystal growth becomes smooth with an enhanced optical coupling being realized among the individual regions. Besides, the manufacturing process can be carried out with improved accuracy. Thus, a semiconductor laser of a lower threshold current than that of the laser according to the first embodiment can be manufactured more easily.

When the manufacturing method described above is adopted, the optical coupling can be realized more smoothly not only between the two different active optical waveguides but also among three or more different active waveguides.

In the semiconductor laser according to the instant embodiment, there arises a possibility that the film thickness of the anti-meltback layer 1916 of the active DBR-region 1901 may become excessively thick, as result of which the light intensity distribution can spread in this region. Accordingly, the structure shown in FIG. 5F is advantageous over the instant embodiment in that the enhanced inter-region optical coupling is realized to facilitate the manufacturing of a low threshold semiconductor laser. However, even in the semicondcutor laser according to the instant embodiment, similar advantage can be assured by selecting appropriately the refractive index of the material for the anti-meltback layer 1916.

Embodiment 9

The semiconductor laser according to the ninth embodiment starts from the structure shown in FIG. 5F and differs from the latter in that the composition of the InGaAsP-active layer 515 constituting the optical amplification region 503 is so selected that the gain peak wavelength emitted thereby is about 1.56 μm longer than the oscillation wavelength of 1.55 μm. Due to this structure, the detuning effect is obtained to thereby allow the spectral line width to be more narrower than that of the device according to the first embodiment.

In the case of the first of eighth embodiments described above, the gain peak wavelength emitted by the material used for the active optical waveguide in the DBR region is shorter than the oscillation wavelength by 0.02 μm. In this conjunction, it is to be mentioned that similar effects can be achieved so long as such differs in the wavelength lies within a range up to 0.06 μm. In particular, in the range from 0.01 μm to 0.06 μm, there can be attained an advantageous effect that the oscillation power is increased owing to the reflection gain in addition to the effects of the broad oscillation wavelength-tunable width and scarcely appreciable variation in the laser powder regardless of change in the oscillation wavelength.

In the foregoing, several examplary embodiments of the present invention have been described in conjunction with the wavelength-tunable distributed Bragg reflection (DBR) type semiconductor lasers. It should however be understood that the present invention my equally be applied to other optical devices such as Mach-Zender interferometers, composite cavity type semiconductor lasers and the like in which parts are required for changing the optical path length while maintaining constant the gain (loss) in the propagation of light.

Embodiment 10

Now, referring to FIG. 11, description will be directed to a tenth exemplary embodiment of the invention which is applied to a high-speed modulating semiconductor laser. An n-type InP-substrate 106 (having a thickness of 100 μm) is formed with a diffraction grating 1112 (having a period of 0.24 μm) by an interference exposure method, whereon there are grown an n-type InGaAsP-optical guide layer 1113 (exhibiting a bandgap wavelength $\lambda_P = 1.3$ μm and having a thickness of 0.15 μm), and a first undoped InGaAsP-active layer 1104 (having $\lambda_P$ equal to 1.56 μm and a thickness of 0.15 μm). Subsequently, the active layer 1104 is removed for an area corresponding to a half of the device by a chemical etching, being followed by growing a second undoped InGaAsP-active layer 1105 ($\lambda_P = 1.53$ μm, a thickness $= 0.15$ μm) over the area where the active layer 1104 has been removed. Thereafter, a p-type InP-cladding layer 120 (having a thickness of 2 μm) and a p-type InGaAsP-cap layer 1118 ($\lambda_P = 1.15$ μm, a thickness $= 0.5$ μm) are grown. Finally, Cr-Au electrodes 1108 and 1109 and an AuGeNi-Au electrode 124 are formed through evaporation. In this device, the period of the diffraction grating is so selected that the laser oscillation wavelength is 1.55 μm which lies intermediate between the gain peak wavelengths of the active layers 1104 and 1105. Thus, difference in the differential gain between them can be used effectively.

When the laser output light is modulated by applying a pulse signal of 2.4 Gb/s to the electrode 1108 in the state in which DC currents are applied to the electrodes 1108 and 1109, respectively, the total spectral width has a spread of 1 Å (angstrom), which is apparently decreased to 1/5 of that of the prior art modulating laser device. Similarly, when the pulse signal is applied to the electrode 1109 in superposition to the DC current, the spectral width is decreased to about ¼ of that of the prior art device.

Embodiment 11

Another embodiment of the invention is shown in FIG. 12. The instant (eleventh) embodiment differs from the tenth embodiment shown in FIG. 11 in that the second undoped InGaAsP-active layer 1105 is replaced by an undoped InGaAsP-active layer 1205 ($\lambda_P = 1.56$ μm, thickness $= 0.06$ μm) and a p-type InGaAsP-optical guide layer 1204 ($\lambda_P = 1.3$ μm, thickness $= 0.09$ μm) grown sequentially.

By applying DC currents of substantially same magnitude to the electrodes 1109 and 1108, the carrier density is increased because of the thickness of the active layer 1205, resulting in that the gain peak wavelength is caused to shift by 1.53 μm in the direction toward the shorter wavelength side due to the band filling effect.

This embodiment is also effective to reduce the wavelength chirping as in the case of the tenth embodiment.

Embodiment 12

Figure 13:
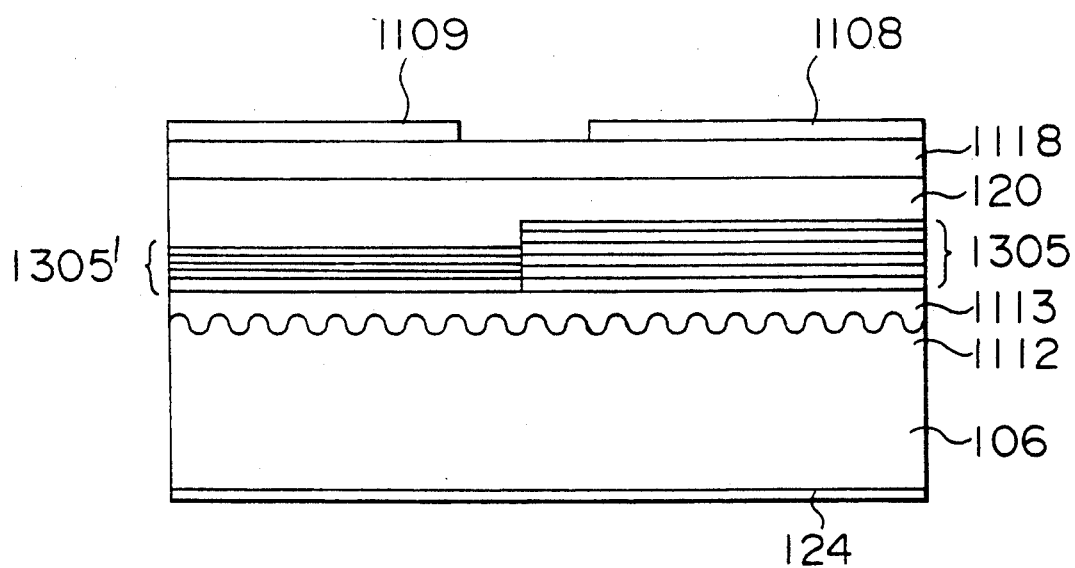

A further (twelfth) embodiment of the invention will be described by reference to FIG. 13. The instant embodiment differs from the tenth and the eleventh in that a quantum well structure is adopted in the active layer. In other words, the active layer is realized in multiple quantum wells. Referring to FIG. 13, there is formed on a right-hand side region 1305 a stack of undoped InGaAsP-barrier layers (each having a bandgap wavelength of 1.35 μm and a thickness $= 100$ Å) and undoped InGaAs-well layers (each having a bandgap wavelength of 1.65 μm and a thickness $= 60$ Å) stacked alternately in ten cycles (pairs). On the other hand, there is formed on the left-hand side region 1305' a stack of undoped InGaAsP-barrier layers (each having a bandgap wavelength of 1.3 μm and a thickness $= 100$ Å) and undoped InGaAs-well layers (each having a bandgap wavelength of 1.65 μm and a thickness of 60 Å) stacked alternately in ten cycles.

The gain peak wavelength of the region 1305 is 1.56 μm, while that of the region 1305' is 1.53 μm. Thus, the wavelength chirping can be reduced as in the case of the other embodiments.

Embodiment 13

Figure 14A:
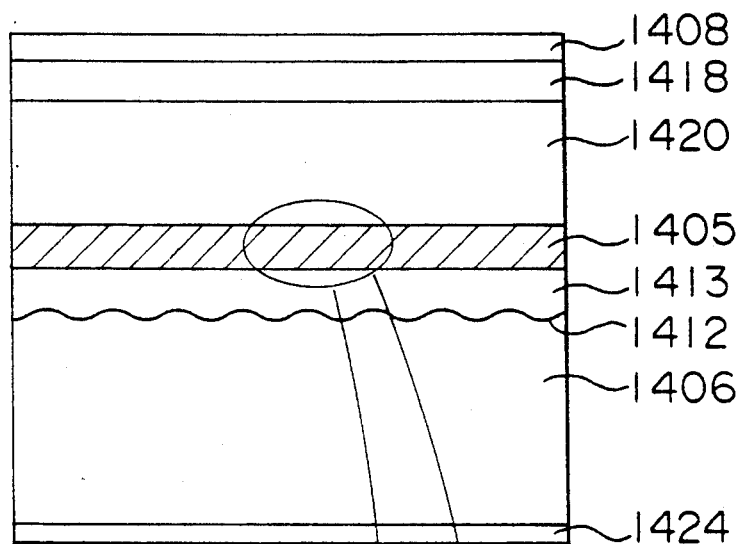
FIGS. 14A and 14B show in a sectional view a semiconductor laser device according to still another embodiment of the present invention and show in an enlarged sectional view an active layer structure of the same, respectively.
Figure 14B:
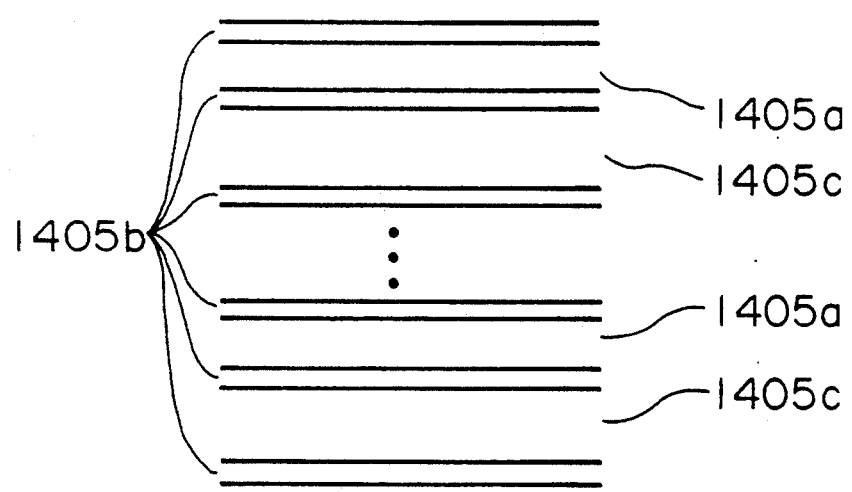
Figure 15:
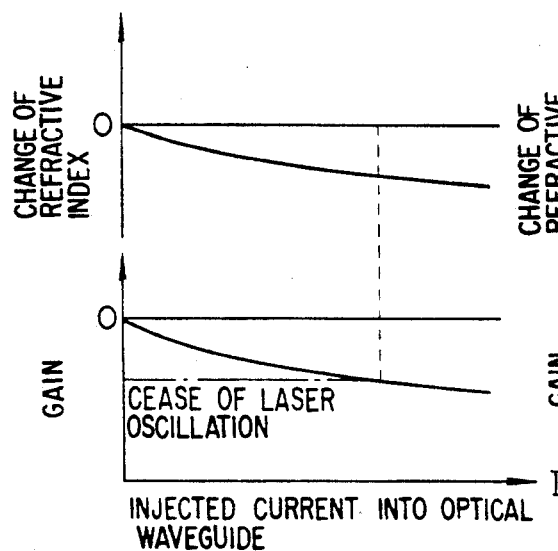
FIG. 15 is a view for illustrating changes of the gain and the refractive index brought about by injection of a in a passive optical waveguide.
Figure 16:
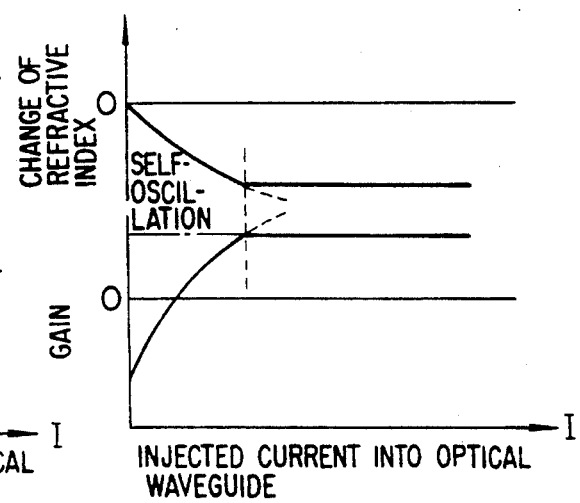
FIG. 16 is a conceptual view for illustrating changes of the gain and the refractive index where a case hitherto known optical waveguide exhibiting a high gain is employed in a diffraction grating region.

Still another embodiment of the invention is shown in FIGS. 14A and 14B. Referring to the figures, grown sequentially on an n-type InP-substrate 1406 having diffraction grating formed thereon are an n-type InGaAsP-optical guide layer 1413 (having $\lambda_P$ of 1.3 μm and a thickness of 0.15 μm), a multiple quantum well active layer 1405 and a p-type InP-cladding layer 1420 (of 2 μm in thickness) and a p-type InGaAsP-cap layer 1418 (having $\lambda_P$ of 1.15 μm and a thickness of 0.5 μm), whereon a Cr-Au electrode 1408 and an AuGeNi-Au electrode 1424 are formed through evaporation. The active layer 1405 is implemented in a stacked structure in which an InGaAsP-barrier layer 1405b (having $\lambda_P$ of 1.3 μm and a thickness of 50 Å), an undoped InGaAs-well layer 1405a (of 60 Å in thickness) and an undoped InGaAs-well layer 1405c (of 70 Å in thickness) are stacked in such a manner as shown in FIG. 14B.

The gain peak wavelength of the well layer 1405a is 1.54 μm because of thinness thereof, while that of the well layer 1405c is 1.5 μm, wherein the oscillation wavelength of the diffraction grating 1412 is 1.55 μm. Thus, the wavelength chirping can be reduced as in the case of the other embodiments.

The foregoing description has been made on the assumption that materials of InGaAsP-series are used. However, it goes without saying that the use of other materials such as of InGaAlAs-series, GaAlAs-series and the like can assure similar advantageous action and effects.

Although the invention has been described with reference to the semiconductor laser devices shown in the drawing, it is to be appreciated that the invention are applicable to other optical devices, including interferometers, resonators, and the like.

The invention has been described with reference to the preferred embodiments. Obviously, modifications and alternations will occur to those of ordinary skill in the art upon reading and understanding the present specification. It is intended that the invention be construed as including all such alterations and modifications in so far as they come within the scope of the appended claims or the equivalent thereof.

What is claimed is:

1. A semiconductor laser device, comprising:
   a plurality of semiconductor regions having active layers optically coupled to one another and susceptible to undergo changes in gain upon injection of carriers;
   said plurality of semiconductor regions including an amplification region having an optical amplification active layer for emitting light in response to the injection of the carriers, and a DBR regions having a gain active layer for guiding the light emitted by said optical amplification active layer and a distributed feedback structure for feeding back the light being guided;
   means for injecting the carriers into said plurality of semiconductor regions; and
   a resonator structure for amplifying the light of a specific wavelength of those emitted by said optical amplification active region by selective feedback through said feedback structure;
   wherein differential gain coefficient to the injected carrier density of said gain active layer is made different from the differential gain coefficient to the injected carrier density in said optical amplification active layer.

2. A semiconductor laser device according to claim 1, wherein a semiconductor material constituting said optical amplification layer is different from a semiconductor material constituting said gain active layer.

3. A semiconductor laser device according to claim 1, wherein said plurality of active layers have a quantum well structure.

4. A semiconductor laser device according to claim 1, wherein the differential gain coefficient of said gain active layer is smaller than that of said optical amplification active layer.

5. A semiconductor laser device according to claim 1 further comprising a phase control region including an optical waveguide layer for light propagation formed of an active semiconductor material.

6. A semiconductor laser device according to claim 5, wherein said phase control region includes an electrode for changing an optical path length of said resonator.

7. A semiconductor laser device according to claim 5, wherein said optical amplification active layer and said gain active layer are optically coupled directly or indirectly through said phase control region.

8. A semiconductor laser device according to claim 1 further comprising a phase control region including an optical waveguide layer for light propagation formed of a passive semiconductor material.

9. A semiconductor laser device according to claim 7, wherein said optical waveguide layer is formed of an active semiconductor material.

10. A semiconductor laser device according to claim 1, wherein said DBR region includes an electrode for changing the refractive index of said distributed feedback structure.

11. A semiconductor laser device, comprising:
    a plurality of semiconductor regions including a plurality of active layers coupled optically and having gains susceptible to change upon injection of carriers;
    means for injecting the carriers into said plurality of the active regions; and
    a resonator structure for amplifying and oscillating light of a specific wavelength differing from said gain peak wavelengths by selectively feeding back the light of said specific wavelength;
    wherein said plurality of the active layers compensate mutually for variations in the refractive index induced by variations in the carrier density.

12. A semiconductor laser device according to claim 11, wherein said plurality of the active layers exhibit different gain peak wavelengths.

13. A semiconductor laser device according to claim 12, wherein said resonator structure amplifies through selective feedback the light having a wavelength differing from said plurality of the gain peak wavelengths as the light of said specific wavelength.

14. A semiconductor laser device according to claim 12, wherein said resonator structure feeds back selectively the light having as said specific wavelength a wavelength lying intermediate between said different peak wavelengths.

15. A semiconductor laser device according to claim 12, wherein said resonator structure feeds back the light having as said specific wavelength a wavelength other than those lying intermediate between said different peak wavelengths.

16. A semiconductor laser device, comprising:
    a plurality of active regions;
    means for injecting the carriers into said active regions; and
    a diffraction grating for feeding back light having a specific wavelength of those emitted from said active regions;
    wherein said diffraction grating is disposed in the vicinity of at least one of said plural active regions, and wherein said plural regions inclusive of said one region differ from one another in respect to change in the gain brought about by the injection of carriers.

17. A semiconductor laser device, comprising:
    a plurality of active regions;
    means for injecting the carriers into said active regions; and
    a diffraction grating for feeding back light having a specific wavelength of those emitted from said active regions;
    wherein said diffraction grating is disposed in the vicinity of at least one of said plural active regions, and wherein said plural regions inclusive of said one region differ from one another in respect to change in the refractive index brought about by the injection of carriers.

18. A semiconductor laser device, comprising:
    a plurality of active regions;
    means for injecting the carriers into said active regions; and
    a diffraction grating for feeding back light having a specific wavelength of those emitted from said active regions;
    wherein said diffraction grating is disposed in the vicinity of at least one of said plural active regions; and
    wherein said plural active layers are made different from one another in respect to magnitude of change in the gain for an amount of carriers injected to thereby suppress self-oscillation only in a specific one of said plural active layers.

19. A semiconductor laser device, comprising:
    a plurality of active layers;

means for injecting the carriers into said plural active layers; and a diffraction grating provided locally for oscillating light of a specific wavelength of those emitted by said active layers;

wherein at least one of said plural active layers is disposed in the vicinity of said diffraction grating, whereby said plural active layers are rendered to differ from one another in respect to magnitude of change in the refractive index for an amount of carriers 20. A semiconductor laser device, comprising:
a plurality of active layers;
means for injecting the carriers into said plural active layers; and
a diffraction grating provided locally for oscillating light of a specific wavelength of those emitted by said active layers;
wherein change of refractive index/change in gain brought about by carrier injection in the first active layer disposed in the vicinity of said diffractive index and/or in at least one of the second one or more active layers are greater than those in the other one(s) of said second active layers.

21. A semiconductor laser device, comprising:
a plurality of active layers;
means for injecting the carriers into said plural active layers; and
a diffraction grating provided locally for oscillating light of a specific wavelength of those emitted by said active layers;
wherein in the first active layer disposed in the vicinity of said diffractive grating and in the second one or more other active layer, either one or both of said first active layer and said second active layer are formed in a multi-layer structure, and wherein at least one of the active layers has a quantum well layer whose thickness is smaller than that of said second active layer.

22. A semiconductor laser device according to claim 18, wherein said means for injecting the carriers are so provided as to be capable of injecting the carriers into said plurality of the active layers independent of one another.

23. A semiconductor laser device according to claim 18, including an optical waveguide for optically coupling said plurality of the active regions to one another.

24. A semiconductor laser device according to claim 18, wherein said active layer provided in the vicinity of said diffraction grating is disposed in parallel with said grating, and wherein oscillation wavelength is changed by changing an amount of carriers injected into said active layer provided in the vicinity of said grating.

25. A semiconductor laser device, comprising:
a plurality of active layers;
means for injecting carriers into said plural active layers; and
a diffraction grating provided locally on a region through which light travels for oscillating light of a specific wavelength of those emitted by said active layers;
wherein variations in refractive index brought about by variations in the amount of injected carriers in said plurality of the active regions are mutually compensated for.

26. A semiconductor laser device, comprising:
a plurality of active layers;
means for injecting carriers into said plural active layers; and
a diffraction grating provided on an optical axis along which light travels for oscillating light of a specific wavelength of those emitted by said active layers;
wherein changes in gain brought about by injection of carriers in said plurality of the active regions are different from one to another active regions.

27. A semiconductor laser device according to claim 25, wherein said plurality of the active layers are disposed in cascade in the direction in which light travels.

28. A semiconductor laser device according to claim 25, wherein said plurality of the active layers are disposed in parallel to the direction in which light travels.

29. A semiconductor laser device according to claim 25, wherein said plurality of the active layers have respective semiconductor crystal compositions differing from one another.

30. A semiconductor laser device according to claim 25, wherein at least one of said plural active layers has a quantum well.

31. A semiconductor laser device according to claim 25, wherein said plurality of the active layers have quantum wells of different thicknesses.

32. A semiconductor laser device according to claim 25, including electrodes for injecting the carriers into said plurality of the active layers independent of one another.

33. A semiconductor laser device, wherein the optical path length of light traveling through a passive semiconductor optical waveguide is changed by changing refractive index of said optical waveguide by injecting carriers thereto, and wherein an optical active layer is disposed in said optical waveguide in parallel with the direction in which light travels through said optical waveguide to thereby reduce absorption loss produced in said optical waveguide by the injection of the carriers.

34. A semiconductor laser device according to claim 33, wherein gain of said optical waveguide is 30 cm$^{-1}$.

35. A semiconductor laser device according to claim 33, wherein the layer thickness of the active material exhibiting maximum gain at the wavelength of light guided through said optical waveguide is not greater than 1/15 of the wavelength for use, and wherein the thickness of the passive guide layer giving rise to absorption loss is not smaller than 1/15 of the wavelength for use.

36. A semiconductor laser device according to claim 33, wherein the wavelength at which said optical active layer exhibits a maximum gain is shorter than that of light guided.

* * * * *

UNITED STATES PATENT AND TRADEMARK OFFICE
CERTIFICATE OF CORRECTION

PATENT NO. : 5,177,758                                    Page 1 of 2
DATED      : January 5, 1993
INVENTOR(S): Akihiko Oka, et al It is certified that error appears in the above-indentified patent and that said Letters Patent is hereby corrected as shown below:

| Column | Line | |
|---|---|---|
| 3 | 1 | After "increasing" delete "is brought about"; after "width" delete "is". |
| 3 | 2 | Delete "brought about". |
| 7 | 67 | Change "exhibiting not a less" to --not exhibiting a lesser--. |
| 8 | 44 | Change "man" to --manufacturing--. |
| 8 | 51 | After "12" insert --and 13 are sectional--. |
| 8 | 60 | After "a" insert --current--. |
| 8 | 63 | Change "where a case" to --in a case where a--. |
| 8 | 67 | After "waveguide" insert --in--. |
| 9 | 7 | After "19F" insert --are--. |
| 10 | 39 | Change "gently" to --a gentle change--. |
| 11 | 49 | Change "wav-" to -- wave- --. |
| 13 | 24 | After "small" insert --a--; change "aimed" to --aimed-for--. |
| 17 | 15 | Change "giving birth to" to --effecting--. |
| 18 | 53 | Change "remain" to --remains--. |
| 19 | 8 | After "to" insert --this--. |

UNITED STATES PATENT AND TRADEMARK OFFICE
CERTIFICATE OF CORRECTION

PATENT NO. : 5,177,758
DATED : January 5, 1993
INVENTOR(S) : Akihiko Oka, et al

It is certified that error appears in the above-indentified patent and that said Letters Patent is hereby corrected as shown below:

| Column | Line | |
|---|---|---|
| 19 | 56 | Delete "protecting by"; after "1925" insert --protects--. |
| 19 | 58 | Change "region" to --regions--. |
| 19 | 59 | Change "$H_{21}SO_4$" to --$H_2SO_4$--. |
| 20 | 57 | Change "eighth" to --eight--. |
| 20 | 63 | Change "differs" to --differences--; change "lies" to --lie--. |
| 21 | 7 | Change "my" to --may--. |
| 22 | 60 | Change "are" to --is--. |
| 23 | 12 | Change "regions" to --region-- |
| 25 | 11 | After "carriers" insert --injected.--. |

Signed and Sealed this

First Day of March, 1994

Attest:

BRUCE LEHMAN

Attesting Officer     Commissioner of Patents and Trademarks